(12) United States Patent
Shimizu et al.

(10) Patent No.: US 9,991,282 B1
(45) Date of Patent: Jun. 5, 2018

(54) THREE-DIMENSIONAL MEMORY DEVICE HAVING PASSIVE DEVICES AT A BURIED SOURCE LINE LEVEL AND METHOD OF MAKING THEREOF

(71) Applicant: SANDISK TECHNOLOGIES LLC, Plano, TX (US)

(72) Inventors: Satoshi Shimizu, Yokkaichi (JP); Hiroyuki Ogawa, Yokkaichi (JP); Yasuo Kasagi, Yokkaichi (JP); Kento Kitamura, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/843,659

(22) Filed: Dec. 15, 2017

Related U.S. Application Data

(62) Division of application No. 15/418,989, filed on Jan. 30, 2017, now Pat. No. 9,876,031.

(Continued)

(51) Int. Cl.
*H01L 23/52* (2006.01)
*H01L 21/00* (2006.01)
(Continued)

(52) U.S. Cl.
CPC .. *H01L 27/11582* (2013.01); *H01L 21/76895* (2013.01); *H01L 23/5226* (2013.01);
(Continued)

(58) Field of Classification Search
CPC ........... H01L 27/11582; H01L 27/1157; H01L 27/0629; H01L 23/5226; H01L 29/42344;
(Continued)

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

WO   WO2002/015277 A2   2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Nicholas Tobergte
(74) *Attorney, Agent, or Firm* — The Marbury Law Group PLLC

(57) ABSTRACT

A layer stack including a lower semiconductor layer, a lower dielectric layer, and a spacer material layer is formed over a semiconductor substrate, and the spacer material layer is patterned to form spacer line structures. An upper dielectric layer and an upper semiconductor layer are formed, followed by formation of an alternating stack of insulating layers and spacer material layers. Memory stack structures are formed through the alternating stack, the upper semiconductor layer, and the dielectric material layer. The upper semiconductor layer, the upper dielectric layer, and the lower semiconductor layer can be patterned to form a buried source layer and at least one passive device. Each passive device can include a lower semiconductor plate, a dielectric material plate, and an upper semiconductor plate. Each passive device can be a resistor or a capacitor.

8 Claims, 37 Drawing Sheets

Related U.S. Application Data

(60) Provisional application No. 62/428,015, filed on Nov. 30, 2016.

(51) Int. Cl.
*H01L 27/11582* (2017.01)
*H01L 27/1157* (2017.01)
*H01L 29/423* (2006.01)
*H01L 27/06* (2006.01)
*H01L 23/522* (2006.01)
*H01L 21/768* (2006.01)
*H01L 29/66* (2006.01)
*H01L 29/792* (2006.01)

(52) U.S. Cl.
CPC ...... *H01L 27/0629* (2013.01); *H01L 27/1157* (2013.01); *H01L 29/42344* (2013.01); *H01L 29/66833* (2013.01); *H01L 29/792* (2013.01)

(58) Field of Classification Search
CPC .............. H01L 29/66833; H01L 29/792; H01L 21/76895
See application file for complete search history.

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,394,716 B2 | 3/2013 | Hwang et al. | |
| 8,643,142 B2 | 2/2014 | Higashitani et al. | |
| 8,901,704 B2 | 12/2014 | Kang | |
| 9,023,719 B2 | 5/2015 | Pachamuthu et al. | |
| 9,305,934 B1 | 4/2016 | Ding et al. | |
| 9,589,981 B2 * | 3/2017 | Nishikawa | H01L 27/11582 |
| 9,646,981 B2 * | 5/2017 | Nishikawa | H01L 27/11526 |
| 2005/0117443 A1 | 6/2005 | Park et al. | |
| 2007/0210338 A1 | 9/2007 | Orlowski | |
| 2007/0252201 A1 | 11/2007 | Kito et al. | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0051492 A1 | 3/2011 | Toda | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0119287 A1 | 5/2012 | Park et al. | |
| 2013/0127011 A1 | 5/2013 | Higashitani et al. | |
| 2013/0130468 A1 | 5/2013 | Higashitani et al. | |
| 2013/0130495 A1 | 5/2013 | Higashitani et al. | |
| 2013/0264631 A1 | 10/2013 | Alsmeier et al. | |
| 2015/0076584 A1 | 3/2015 | Pachamuthu et al. | |
| 2015/0179660 A1 | 6/2015 | Yada et al. | |
| 2016/0351709 A1 | 12/2016 | Nishikawa et al. | |
| 2016/0365351 A1 | 12/2016 | Nishikawa et al. | |
| 2016/0365352 A1 | 12/2016 | Nishikawa et al. | |
| 2017/0148811 A1 * | 5/2017 | Zhang | H01L 27/11582 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

International Search Report, PCT/US2013/035567, dated Sep. 30, 2013, 6pgs.

Non-Final Office Communication for U.S. Appl. No. 14/739,284, filed Jun. 15, 2015, dated Apr. 8, 2016, 10 pages.

Invitation to Pay Additional Fees and Communication Relating to the Results of the Partial International Search from the International Searching Authority for International Application No. PCT/US2016/036771, dated Oct. 11, 2016, 7 pages.

International Search Report and Written Opinion of the International Searching Authority from the International Searching Authority for International Application No. PCT/US2016/036771, dated Dec. 2, 2016, 21 pages.

\* cited by examiner

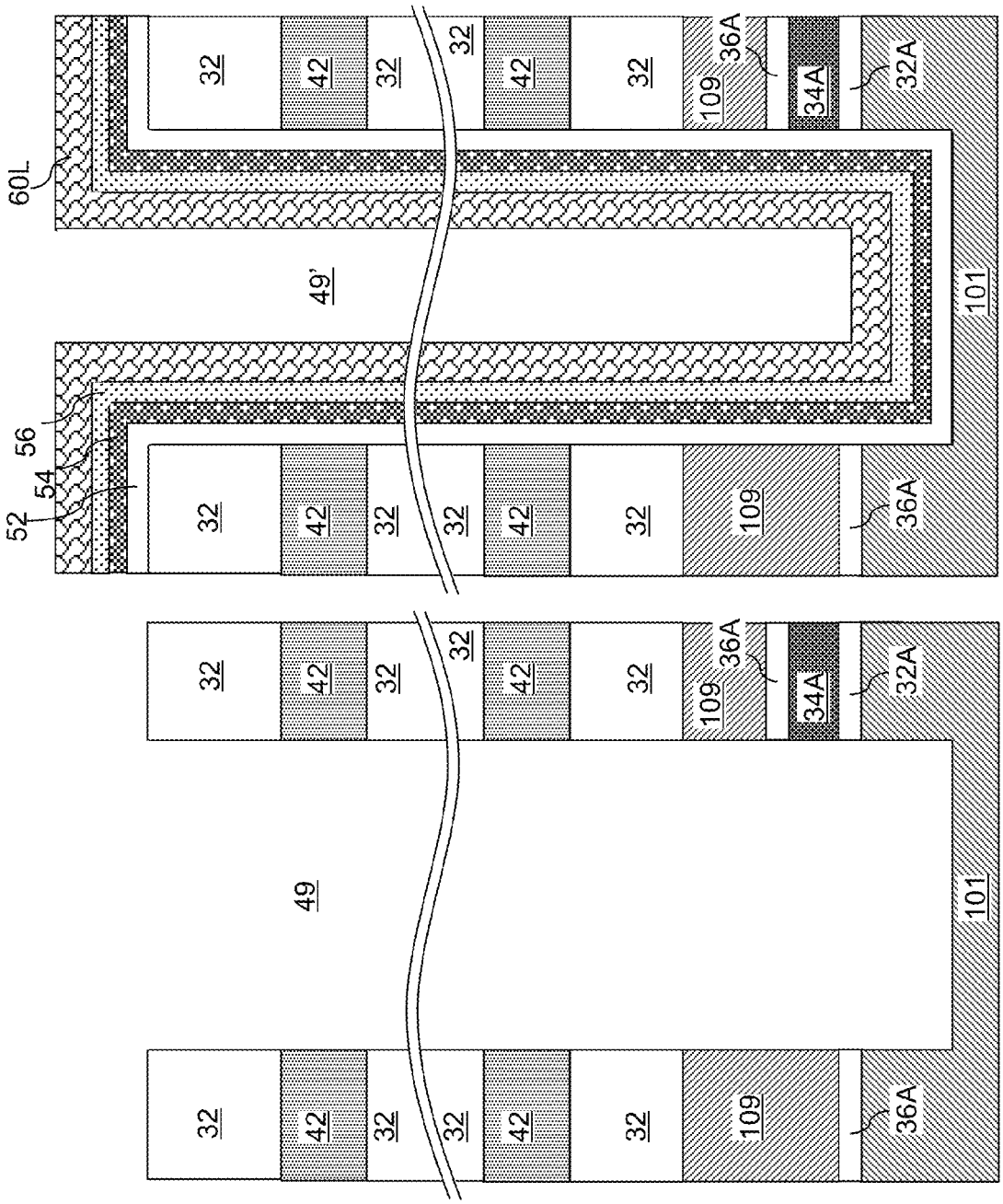

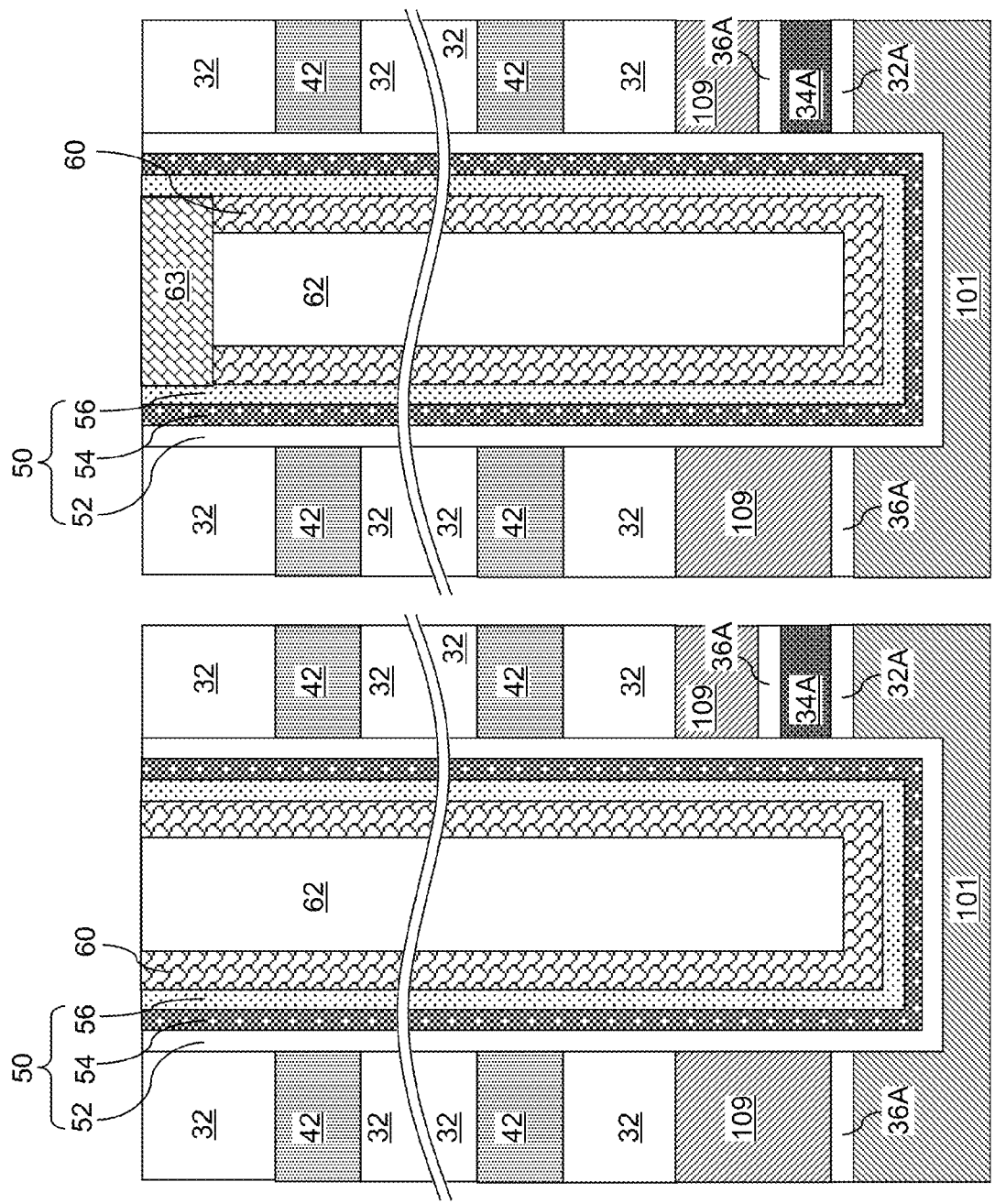

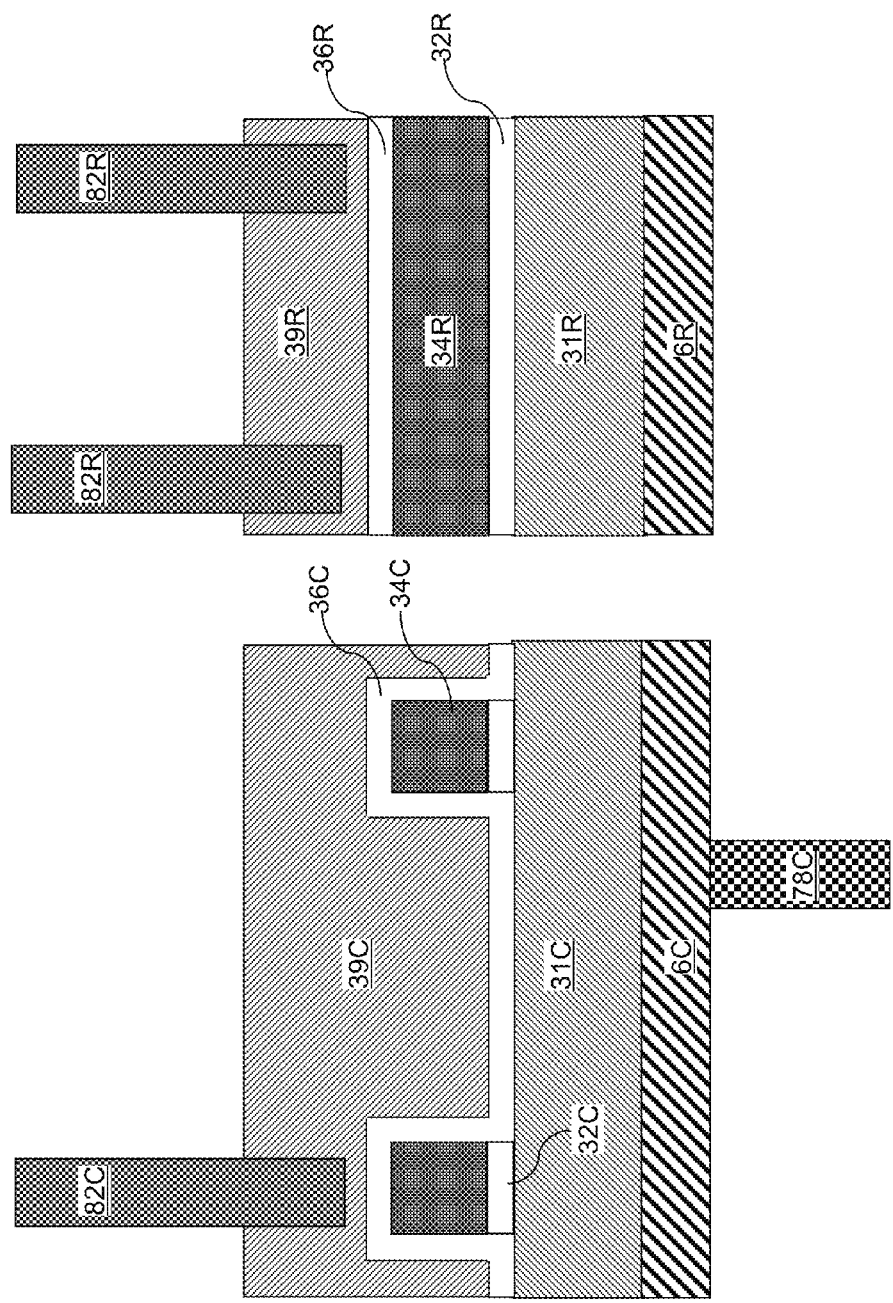

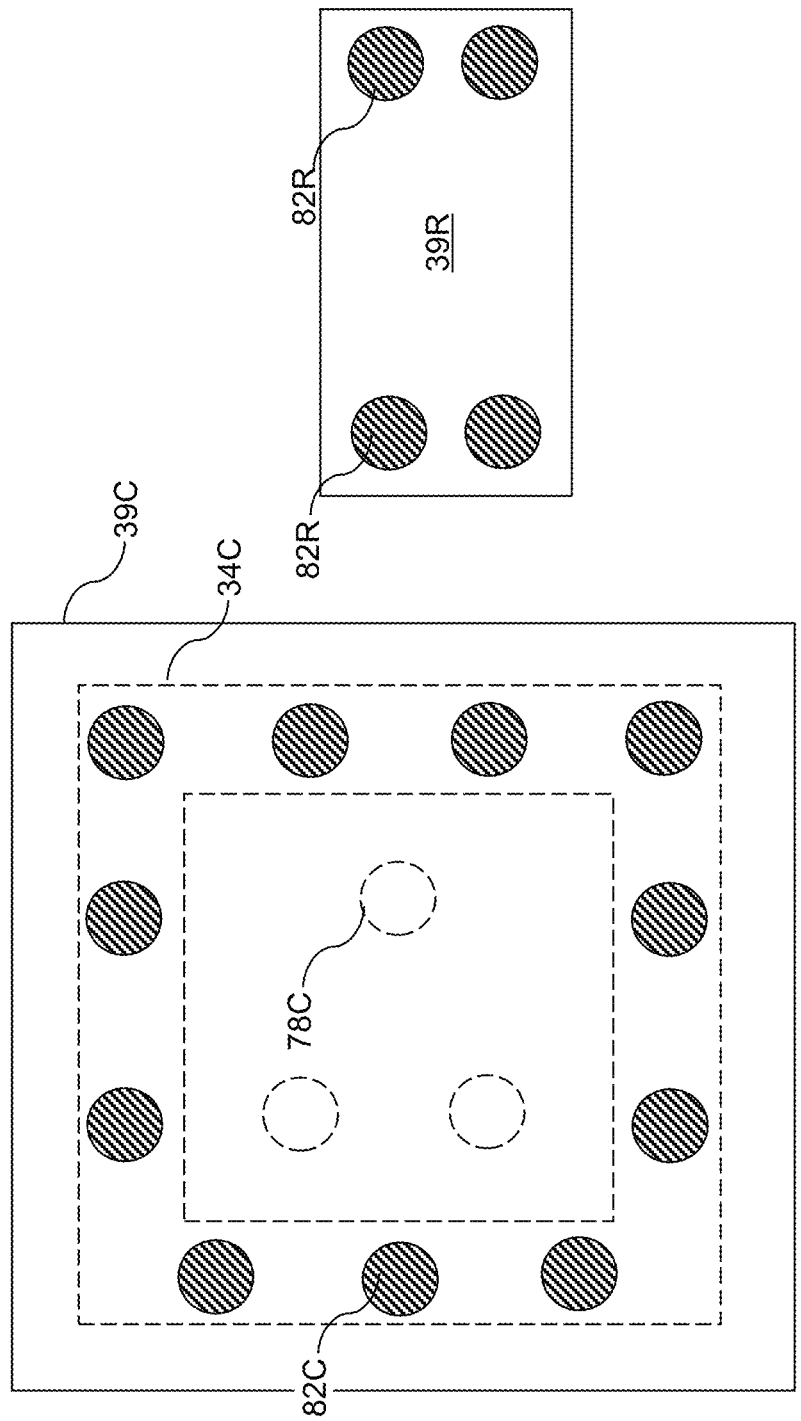

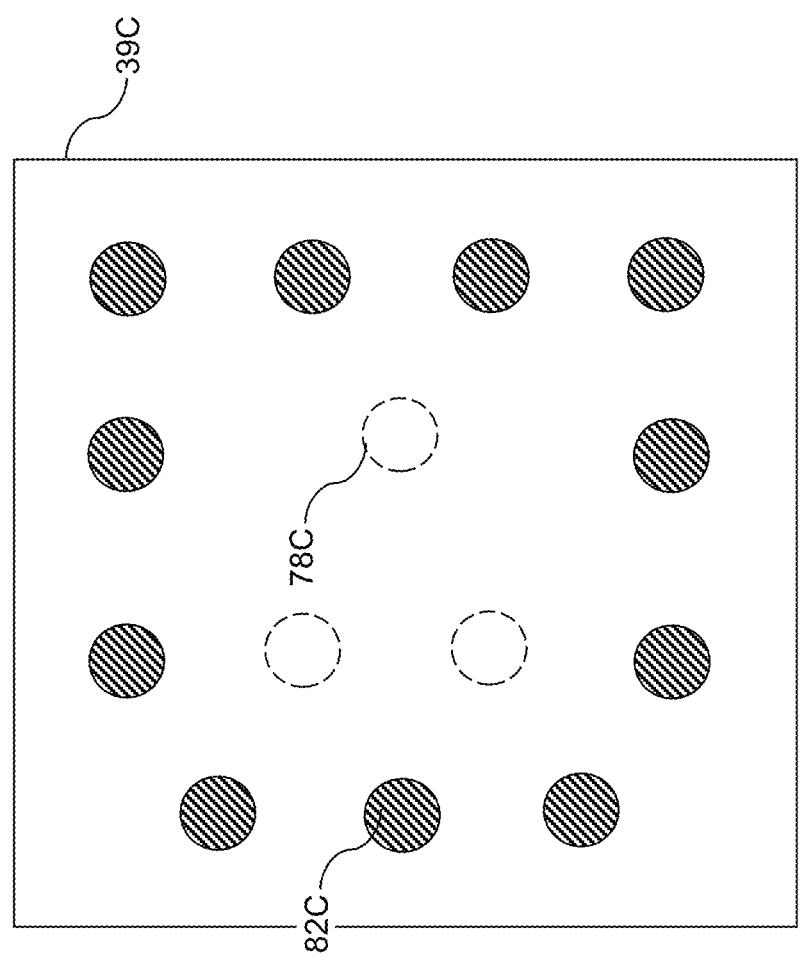

THREE-DIMENSIONAL MEMORY DEVICE HAVING PASSIVE DEVICES AT A BURIED SOURCE LINE LEVEL AND METHOD OF MAKING THEREOF

FIELD

The present disclosure relates generally to the field of semiconductor devices and specifically to passive devices formed at a buried source line level of a three-dimensional memory device, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

Peripheral devices for the three-dimensional stacked memory structure employ passive devices such as capacitors and resistors. Such passive devices typically require dedicated processing steps in dedicated chip areas. A method of providing such peripheral devices at a low cost is thus desired.

SUMMARY

According to an aspect of the present disclosure, a semiconductor structure is provided, which comprises: a first layer stack located over a semiconductor substrate and including a patterned lower semiconductor layer, a patterned dielectric material layer, and a patterned upper semiconductor layer, wherein semiconductor line structures extend through openings in the patterned dielectric material layer; an alternating stack of insulating layers and electrically conductive layers overlying the first layer stack; memory stack structures extending through the alternating stack, the patterned upper semiconductor layer, and the dielectric material layer; and at least one passive device located at a same level as the buried source layer. Each of the at least one passive device comprising a respective second layer stack that includes: a lower semiconductor plate that is vertically spaced from the semiconductor substrate by a same distance as the patterned lower semiconductor layer is from the semiconductor substrate; a dielectric material plate contacting the lower semiconductor plate and vertically spaced from the semiconductor substrate by a same distance as the patterned dielectric material layer is from the semiconductor substrate; and an upper semiconductor plate contacting a top surface of the dielectric material plate. The at least one passive device comprises at least one of a resistor and a capacitor.

According to another aspect of the present disclosure, a monolithic three dimensional NAND memory device comprises a buried source line, an alternating stack of insulating layers and electrically conductive word line layers overlying the buried source line, memory stack structures extending through the alternating stack and the buried source line, wherein each memory stack structure comprises a memory film and a vertical semiconductor channel having at least one sidewall in contact with the buried source line, and at least one passive device located at a same level as the buried source line.

According to yet another aspect of the present disclosure, a method of forming a semiconductor structure is provided. A layer stack comprising a lower semiconductor layer, a lower dielectric layer, and a spacer material layer is formed over a semiconductor substrate. The spacer material layer is patterned to form spacer line structures that extend along a first horizontal direction in an array region. An upper dielectric layer and an upper semiconductor layer are formed over the spacer line structures and the lower semiconductor layer. An alternating stack of insulating layers and spacer material layers is formed over the upper semiconductor layer in the array region. Memory stack structures extending through the alternating stack, the upper semiconductor layer, and the dielectric material layer are formed. At least the upper semiconductor layer, the upper dielectric layer, and the lower semiconductor layer are patterned to form a first layer stack including a patterned lower semiconductor layer, a patterned upper dielectric layer, and a patterned upper semiconductor layer and at least one passive device. The at least one passive device includes a respective second layer stack that comprises: a lower semiconductor plate that is a patterned portion of the lower semiconductor layer; a dielectric material plate that is a patterned portion of the upper dielectric layer; and an upper semiconductor plate that is a patterned portion of the upper semiconductor layer. The at least one passive device comprises at least one of a resistor and a capacitor.

BRIEF DESCRIPTION OF THE DRAWINGS

FIGS. 11A-11D are sequential schematic vertical cross-sectional views of a memory opening during formation of a memory stack structure, a dielectric core, and a drain region according to an embodiment of the present disclosure.

FIG. 23A is a schematic vertical cross-sectional view of a first exemplary capacitor structure according to an embodiment of the present disclosure.

FIG. 23B is a plan view of the first exemplary capacitor structure of FIG. 23A.

FIG. 24A is a schematic vertical cross-sectional view of a first exemplary resistor structure according to an embodiment of the present disclosure.

FIG. 24B is a plan view of the first exemplary resistor structure of FIG. 24A.

FIG. 25B is a plan view of the first exemplary capacitor structure of FIG. 25A.

DETAILED DESCRIPTION

Figure 1:
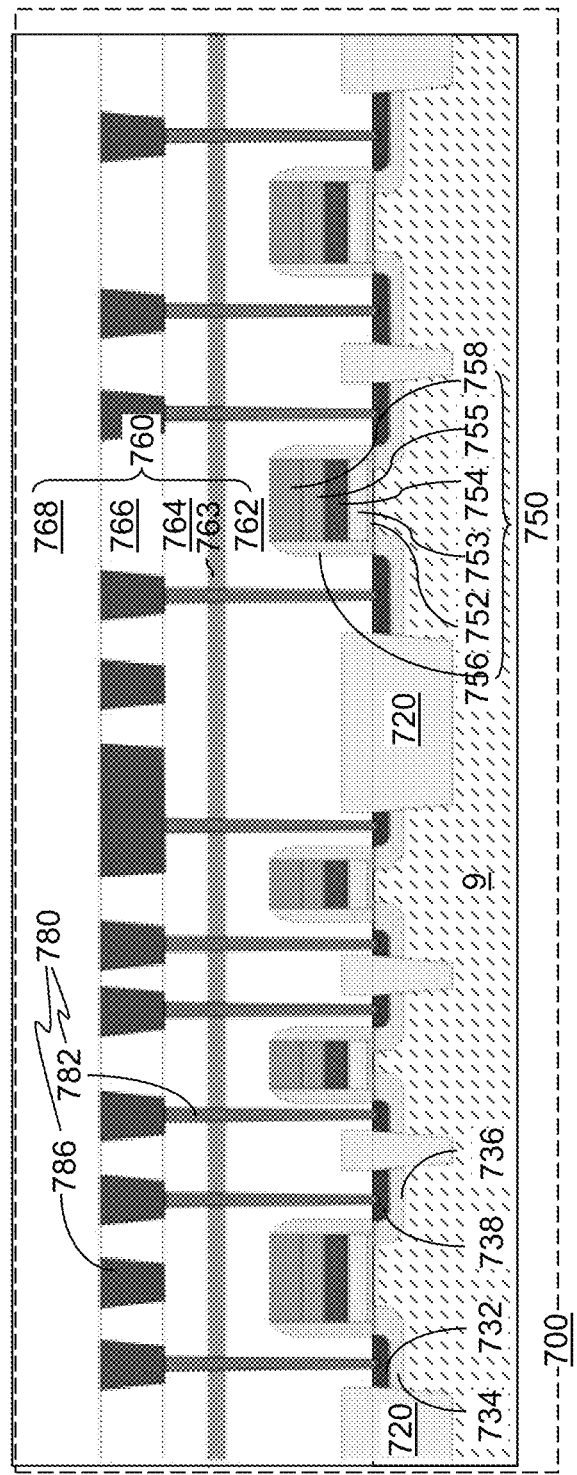
FIG. 1 is a vertical cross-sectional view of an exemplary structure after formation of semiconductor devices, at least one lower level dielectric layer, and lower level metal interconnect structures on a semiconductor substrate according to an embodiment of the present disclosure.

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane including topmost surfaces of an array of memory elements and a second horizontal plane including bottommost surfaces of the array of memory elements. As used herein, a "through-memory-level" element refers to an element that vertically extends through a memory level.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIG. 1, an exemplary structure according to an embodiment of the present disclosure is illustrated. The exemplary structure includes a semiconductor substrate (e.g., silicon wafer) 9, and semiconductor devices formed thereupon. The semiconductor devices can include transistors, at least some of which may be, for example, field effect transistors including respective source regions, drain regions, channel regions, and gate structures 750. Shallow trench isolation structures 720 can be formed in an upper portion of the semiconductor substrate 9 to provide electrical isolation among the semiconductor devices. The transistor channel is located in the upper portion of the semiconductor substrate 9 between the source and drain regions.

Each gate structure 750 can include, for example, a gate dielectric 752, a gate electrode (753, 754, 7(50, 60)), a gate cap dielectric 758, and a dielectric gate spacer 756. The gate electrode (753, 754, 7(50, 60)) can include a stack of multiple gate electrode layers such as a polysilicon gate electrode 753, an optional metal silicide gate electrode 754, and an optional metal gate electrode 7(50, 60). Source regions 732 and drain regions 738 can be formed around each gate structure 750. Optionally, source extension regions 734 can be formed between a respective pair of a gate structure 750 and a source region 732. Likewise, drain extension regions 736 can be formed between a respective pair of a gate structure 750 and a drain region 738.

The semiconductor devices can include any semiconductor circuitry to support operation of a memory structure to be subsequently formed, which is typically referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 760. The at least one lower level dielectric layer 760 can include, for example, a planarization dielectric layer 762 that is employed to provide a planar surface overlying the gate structures 750, an optional planar liner 763, and at least one lower level interconnect dielectric layer (764, 766, 768). The at least one lower level interconnect dielectric layer (784, 866, 768) can include, for example, a first lower via level dielectric layer 764, a lower line level dielectric layer 766, and a second lower via level dielectric layer 768. Optionally, the at least one lower level dielectric layer 760 can include a dielectric liner (such as a silicon nitride liner) that underlies the planarization dielectric layer 762 and blocks diffusion of mobile ions and/or apply appropriate stress to underlying structures. The at least one lower level dielectric layer 760 functions as a dielectric matrix for lower level metal interconnect structures 780 that provide electrical wiring among the various nodes of the semiconductor devices and landing pads for through-memory-level via structures to be subsequently formed.

The lower level metal interconnect structures 780 can include various lower level conductive via structures 782 and lower level metal lines 786. A subset of the lower level metal lines 786 can be configured to function as landing pads for contact via structures to be subsequently formed. The region of the semiconductor devices and the combination of the at least one lower level dielectric layer 760 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 760.

The lower level metal interconnect structures 780 can be electrically shorted to nodes (i.e., source and drain regions) of the semiconductor devices, and are located at the level of the at least one lower level dielectric layer 760. The through-memory-level via structures (not shown in FIG. 1) can be subsequently formed directly on the lower level metal interconnect structures 780 to provide electrically conductive paths between the semiconductor devices on the semiconductor substrate 9 and the various word lines and/or bit lines of three-dimensional memory devices to be subsequently formed.

Figure 2:
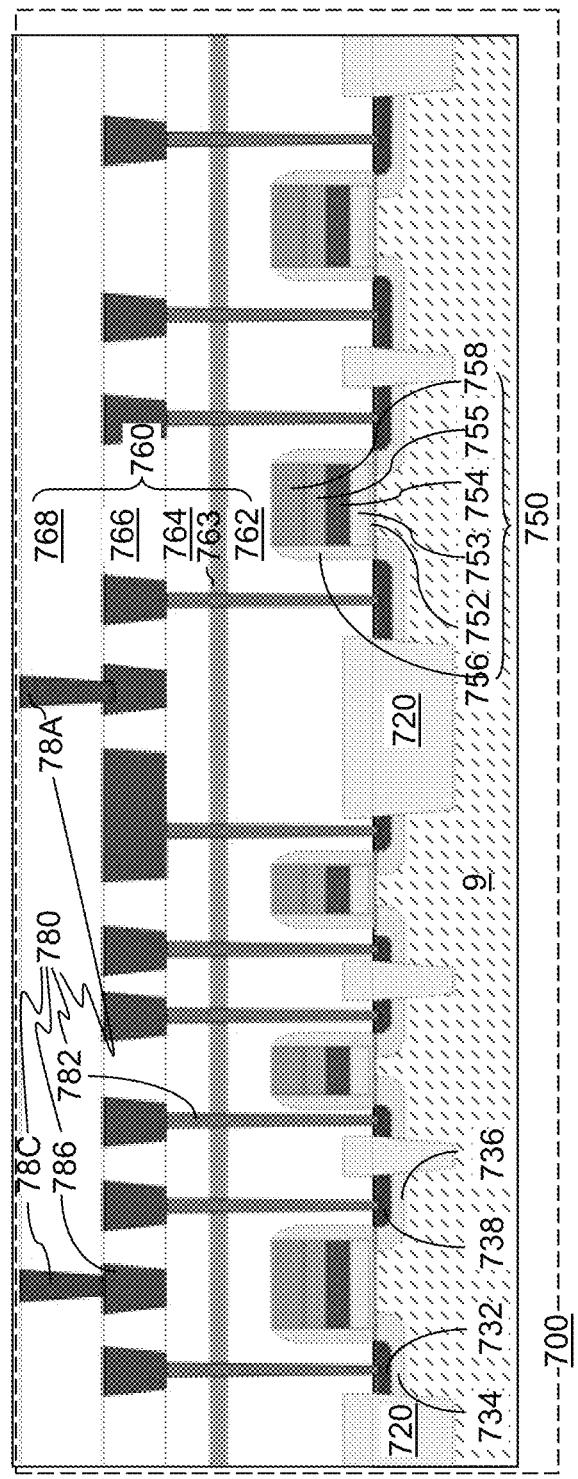
FIG. 2 is a vertical cross-sectional view of the exemplary structure after formation of lower level contact via structures according to an embodiment of the present disclosure.

Referring to FIG. 2, underside contact via structures (78A, 78C) (e.g., metal structures, such as tungsten structures) can be formed on a subset of the lower level metal lines 786 within the at least one lower level interconnect dielectric layer (764, 766, 768). For example, the underside contact via structures (78A, 78C) can be formed directly on top surfaces of the subset of the lower level metal lines 786 within the second lower via level dielectric layer 768. The underside contact via structures (78A, 78C) can include, for example, an underside array source contact via structure 78A that is electrically shorted to source regions of a three-dimensional memory structure to be subsequently formed, and an underside capacitor contact via structure 78C that is electrically shorted to a lower electrode of a capacitor to be subsequently formed. The lower level conductive via structures 782 and the underside contact via structures (78A, 78C) are collectively referred to as lower level via structures (782, 78A, 78C). The lower level metal interconnect structure 780 is embedded within at least one lower interconnect level dielectric layer 760.

Figure 3:
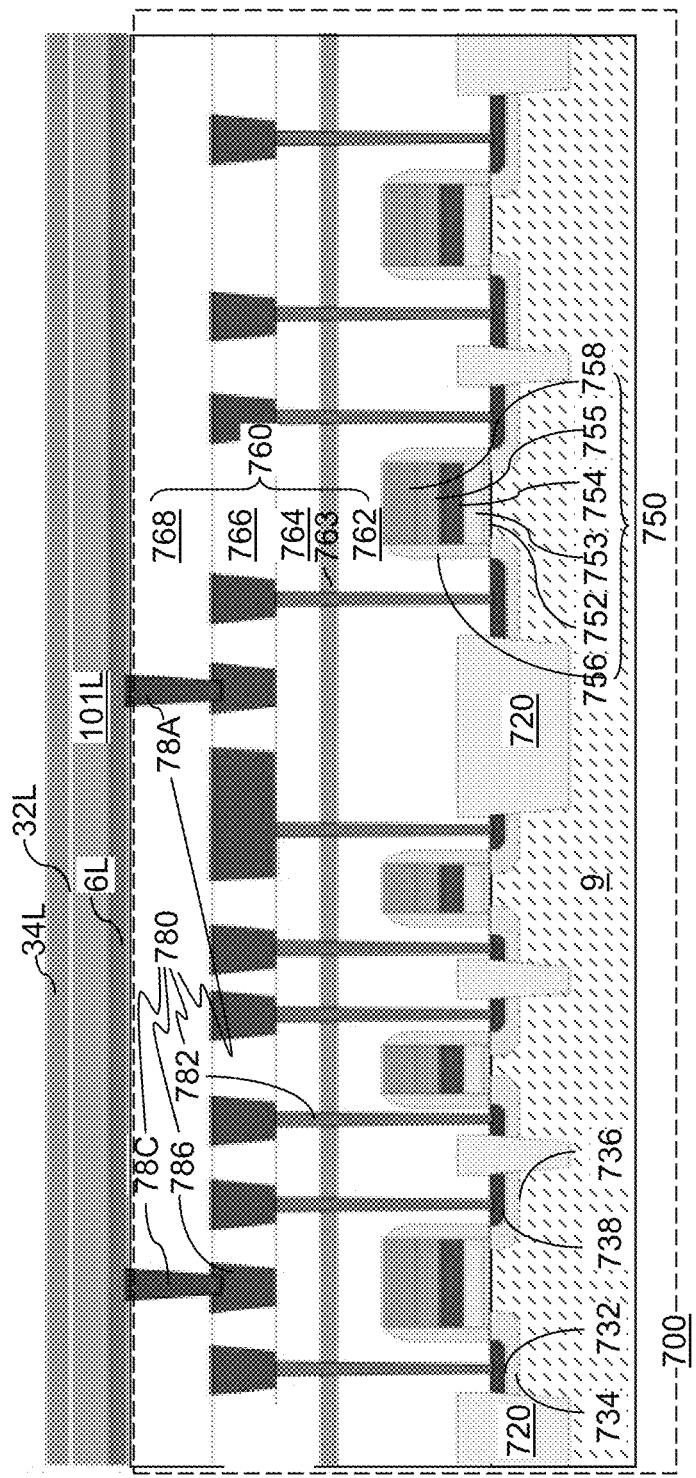
FIG. 3 is a vertical cross-sectional view of the exemplary structure after formation of a layer stack comprising a lower semiconductor layer, a lower dielectric layer, and a spacer material layer according to an embodiment of the present disclosure.

Referring to FIG. 3, a layer stack (6L, 101L, 32L, 34L) including an optional metallic material layer 6L, a lower semiconductor layer 101L, a lower dielectric layer 32L, and a spacer material layer 34L can be formed over a planar top surface of the at least one lower interconnect level dielectric layer 760 and the lower level metal interconnect structure 780 embedded therein.

The optional metallic material layer 6L, if present, can include a metal silicide such as tungsten silicide or cobalt silicide. In this case, the metallic material layer 6L can be deposited, for example, by sputtering. The thickness of the metallic material layer 6L can be in a range from 5 nm to 100 nm, although lesser and greater thicknesses can also be employed. Alternatively, the metallic material layer 6L may include a stack, from bottom to top, of a metallic nitride liner such as a TiN liner and a metal layer such as a tungsten layer. In this case, at least an upper portion of the metal layer can be subsequently converted into a metal silicide layer during a thermal anneal process.

The lower semiconductor layer 101L can include a conductive doped semiconductor material having a doping of a first conductivity type, which may be p-type or n-type. The lower semiconductor layer 101L can include doped polysilicon, a doped silicon-containing semiconductor alloy, a doped compound semiconductor material (such as a doped III-V compound material), or a doped organic semiconductor material. The thickness of the lower semiconductor layer 101L can be in a range from 20 nm to 200 nm, although lesser and greater thicknesses can also be employed. In one embodiment, the lower semiconductor layer 101L can include n-doped polysilicon.

The lower dielectric layer 32L includes a dielectric material such as silicon oxide, silicon nitride, or a dielectric metal oxide. The thickness of the lower dielectric layer 32L can be in a range from 2 nm to 10 nm, although lesser and greater thicknesses can also be employed. In one embodiment, the lower dielectric layer 32L includes silicon oxide.

The spacer material layer 34L includes a material that can be removed selective to the lower dielectric layer 32L and the lower semiconductor layer 101L. For example, the spacer material layer 34L can include a dielectric material such as silicon nitride or a semiconductor material such as germanium. The thickness of the spacer material layer 34L can be selected based on the target thickness of straps to be subsequently formed to contact sidewalls of semiconductor channels. For example, the thickness of the spacer material layer 34L can be in a range from 20 nm to 80 nm, although lesser and greater thicknesses can also be employed.

Figure 4A:
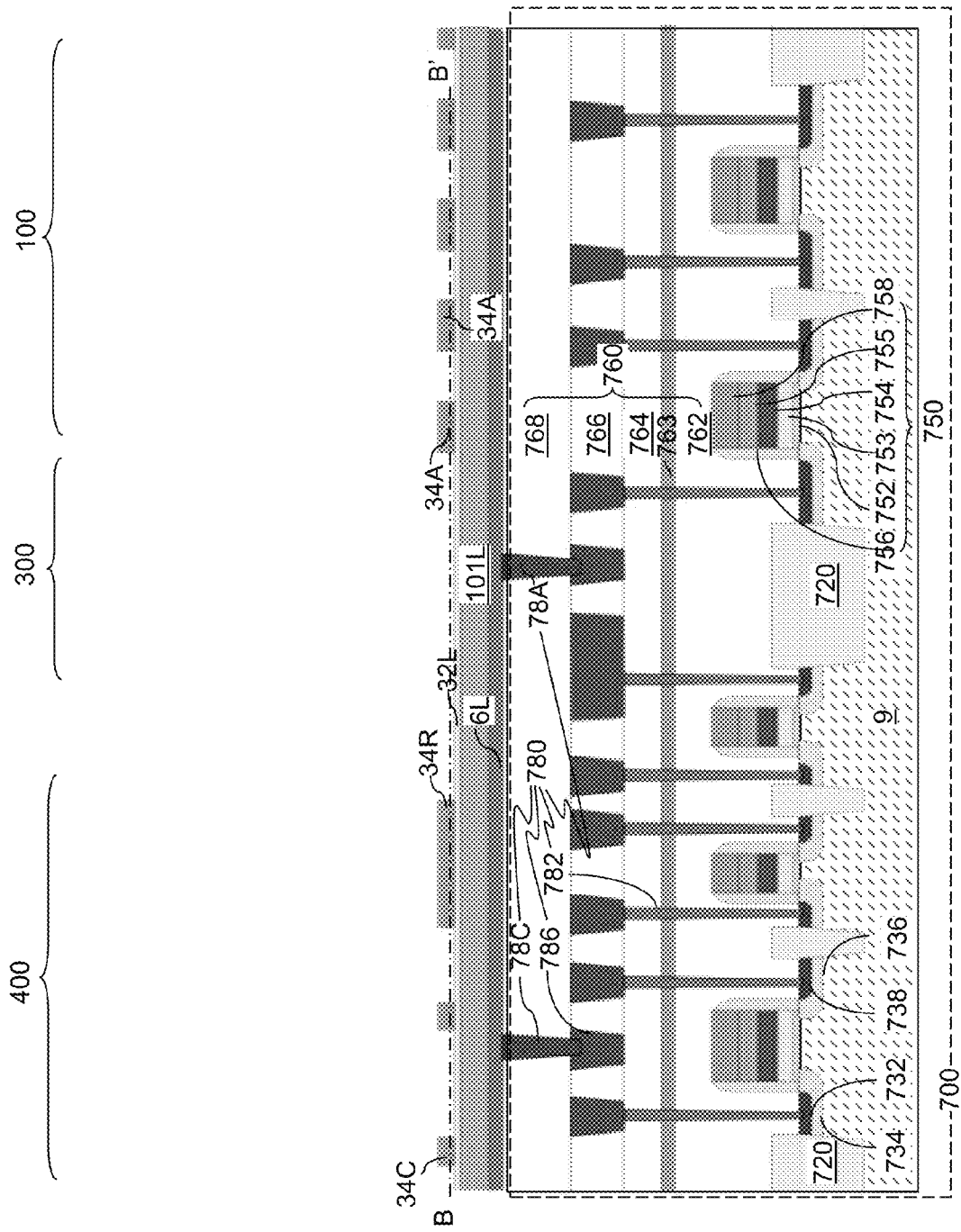
FIG. 4A is a vertical cross-sectional view of the exemplary structure after patterning of the layer stack to form spacer line structures that extend along a first horizontal direction in an array region and spacer plates in a peripheral region according to an embodiment of the present disclosure.
Figure 4B:
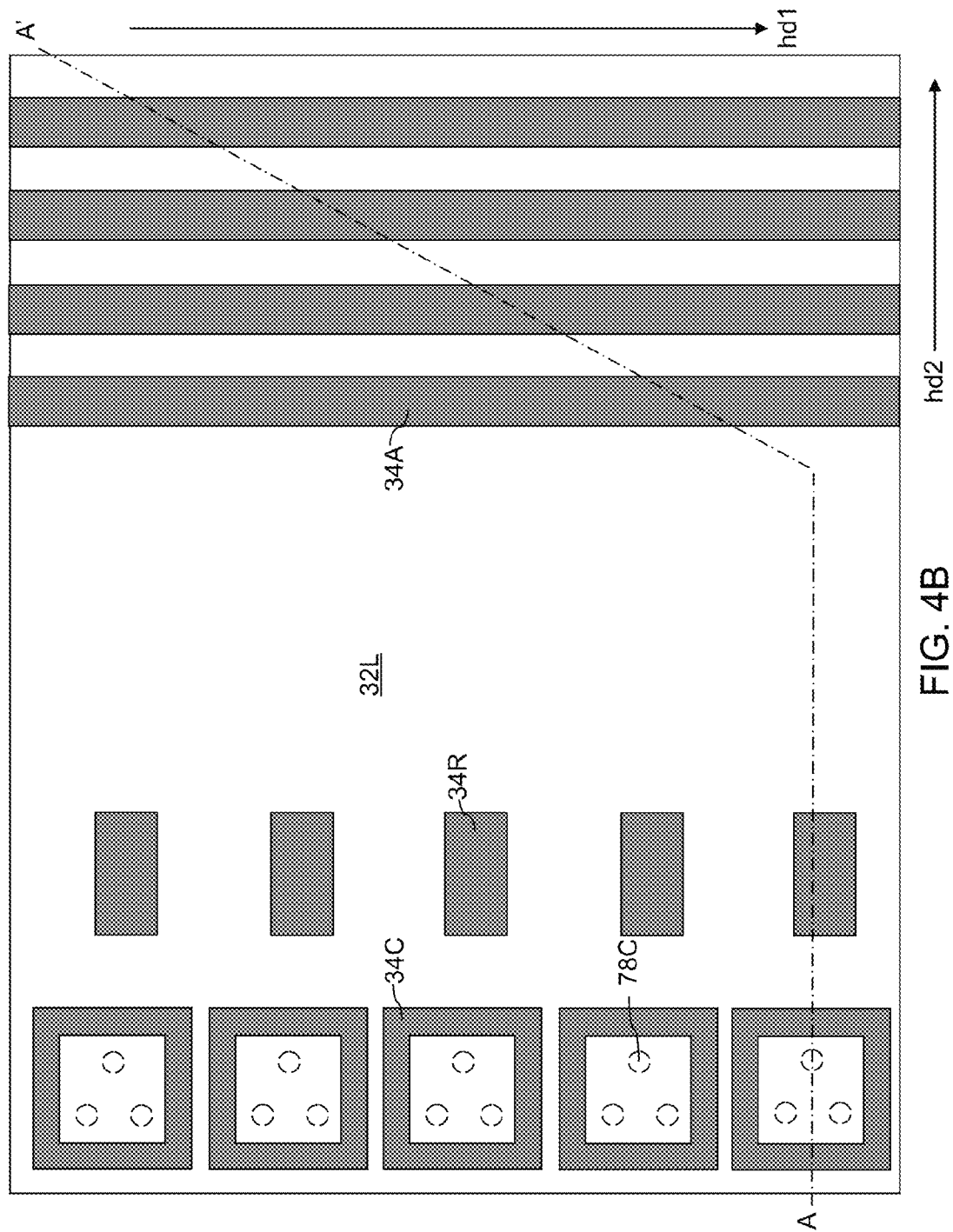
FIG. 4B is a horizontal cross-sectional view of the exemplary structure along the horizontal plane B-B' in FIG. 4A. The zig-zag vertical plane A-A' corresponds to the plane of the vertical cross-sectional view of FIG. 4A.

Referring to FIGS. 4A and 4B, the spacer material layer 34L can be patterned to form spacers, such as spacer line structures 34A that extend along a first horizontal direction hd1 in an array region 100 and spacer plates (34R, 34C) in a peripheral region 400. For example, a photoresist layer can be applied over the spacer material layer 34L, and can be lithographically patterned. The pattern in the photoresist layer can be transferred through the spacer material layer 34L by an etch process, which can be an anisotropic etch such as a reactive ion etch. The photoresist layer can be subsequently removed, for example, by ashing. The array region 100 refers to a region in which a three-dimensional memory array is to be subsequently formed. A peripheral region 400 refers to a region located at a periphery of the array region 100. A contact region 300 can be provided between the array region 100 and the peripheral region 400.

The spacer line structures 34A can have a uniform width (measured in the widthwise direction) that is invariant along the first horizontal direction hd1. The widthwise direction can be a second horizontal direction hd2 that is perpendicular to the first horizontal direction hd1. The spacer line structures 34A can form a periodic one-dimensional array having a pitch along the second horizontal direction hd2. In one embodiment, the pitch of the spacer line structures 34A can be the same as the pitch of memory stack structures to be subsequently formed along the second horizontal direction hd2.

The spacer plates (34R, 34C) can include resistor spacer plates 34R and capacitor spacer plates 34C. While the present disclosure is described employing an embodiment in which the resistor spacer plates 34R and the capacitor spacer plates 34C are simultaneously formed, embodiments are expressly contemplated herein in which only resistor spacer plates 34R or only capacitor spacer plates 34C are formed.

The resistor spacer plates 34R can have a horizontal cross-sectional shape of any suitable shape for providing a horizontal resistive path between two ends. For example, the resistor spacer plates 34R can have a polygonal (e.g., rectangular) shape, an irregular (e.g., tortuous or maze) shape, or any other shape that provides a horizontal path between two ends. If formed, the resistor spacer plates 34R can be permanent structures that remain in a final device structure. The resistor spacer plates 34R are optional components for forming a resistor structure. In other words, a resistor structure to be subsequently formed may, or may not, include a respective resistor spacer plate 34R.

Each of the capacitor spacer plates 34C can be formed as a continuous structure or as a set of discrete structures. Each capacitor spacer plate 34C can be formed in areas in which an upper contact via structure is to be subsequently formed on an upper electrode of a respective capacitor. In a non-limiting illustrative example, a capacitor spacer plate 34C can have a generally annular shape (e.g., hollow polygonal shape, ring shape, etc.) having an opening that overlies a respective set of at least one underside capacitor contact via structure 78C. The capacitor spacer plates 34C are optional components for forming a capacitor structure. In other words, a capacitor structure to be subsequently formed may, or may not, include a respective capacitor spacer plate 34C. If formed, the capacitor spacer plates 34C can be permanent structures that remain in a final device structure, and provide electrical isolation between upper capacitor contact via structures to be subsequently formed and a lower electrode of each capacitor.

Figure 5:
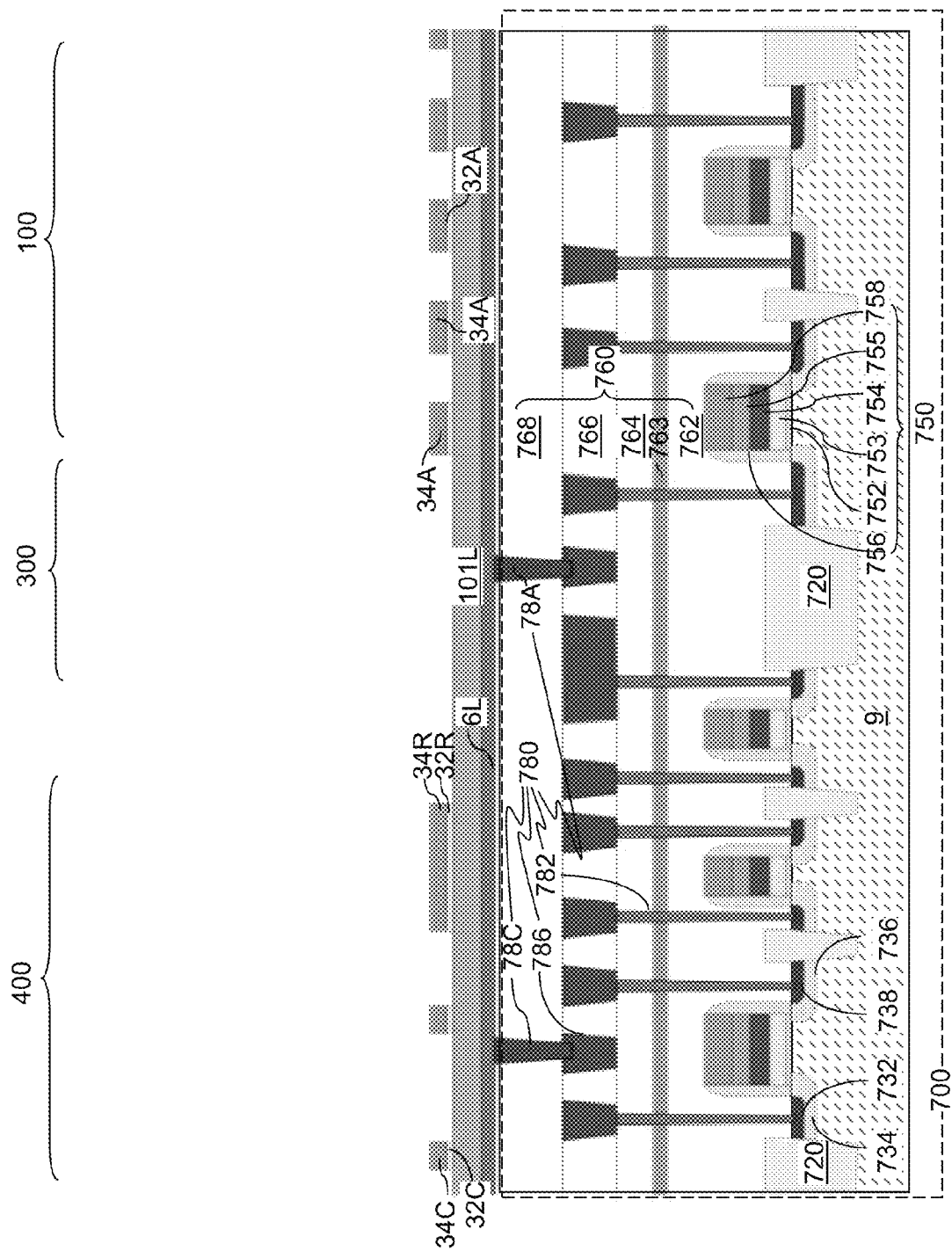
FIG. 5 is a vertical cross-sectional view of the exemplary structure after patterning the lower dielectric layer according to an embodiment of the present disclosure.

Referring to FIG. 5, the lower dielectric layer 32L can be patterned by etching the physically exposed portions of the lower dielectric layer 32L, for example, by an isotropic etch such as a wet etch. For example, if the lower dielectric layer 32L includes silicon oxide, a wet etch employing hydrofluoric acid can be employed to etch physically exposed portions of the lower dielectric layer 32L. Remaining portions of the lower dielectric layer 32L after patterning include array dielectric liners 32A underlying the spacer line structures 34A, resistor dielectric liners 32R underlying the resistor spacer plates 34R, and capacitor dielectric liners 32C underlying the capacitor spacer plates 34C. Each array dielectric liner 32A can have a substantially same horizontal cross-sectional shape as an overlying spacer line structure 34A, each resistor dielectric liner 32R can have a substantially same horizontal cross-sectional shape as an overlying resistor spacer plate 34R, and each capacitor dielectric liner 32C can have a substantially same horizontal cross-sectional shape as an overlying capacitor spacer plate 34C. The resistor dielectric liners 32R are optional components for forming a resistor structure. In other words, a resistor structure to be subsequently formed may, or may not, include a respective resistor dielectric liner 32R. Likewise, the capacitor dielectric liners 32C are optional components for forming a capacitor structure. In other words, a capacitor structure to be subsequently formed may, or may not, include a respective capacitor dielectric liner 32C.

Figure 6:
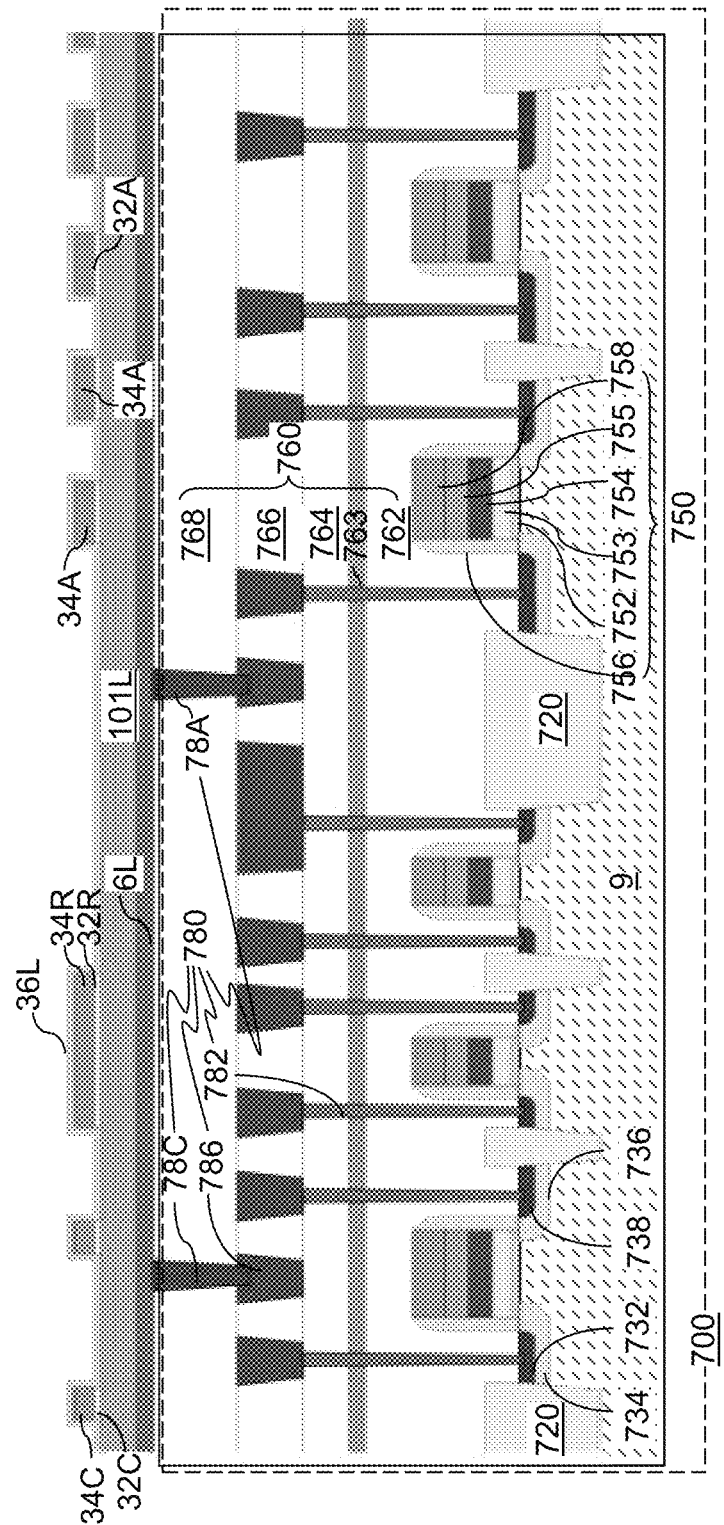
FIG. 6 is a vertical cross-sectional view of the exemplary structure after formation of an upper dielectric layer according to an embodiment of the present disclosure.

Referring to FIG. 6, an upper dielectric layer 36L can be deposited over the spacer line structures 34A and the spacer plates (34R, 34C). The upper dielectric layer 36L includes a dielectric material such as silicon oxide, silicon nitride, or a dielectric metal oxide. The upper dielectric layer 36L may be formed as a single continuous layer by a conformal deposition process such as chemical vapor deposition or atomic layer deposition. The thickness of the upper dielectric layer 36L can be in a range from 2 nm to 20 nm, although lesser and greater thicknesses can also be employed. In one embodiment, the upper dielectric layer 32L includes silicon oxide.

Figure 7:
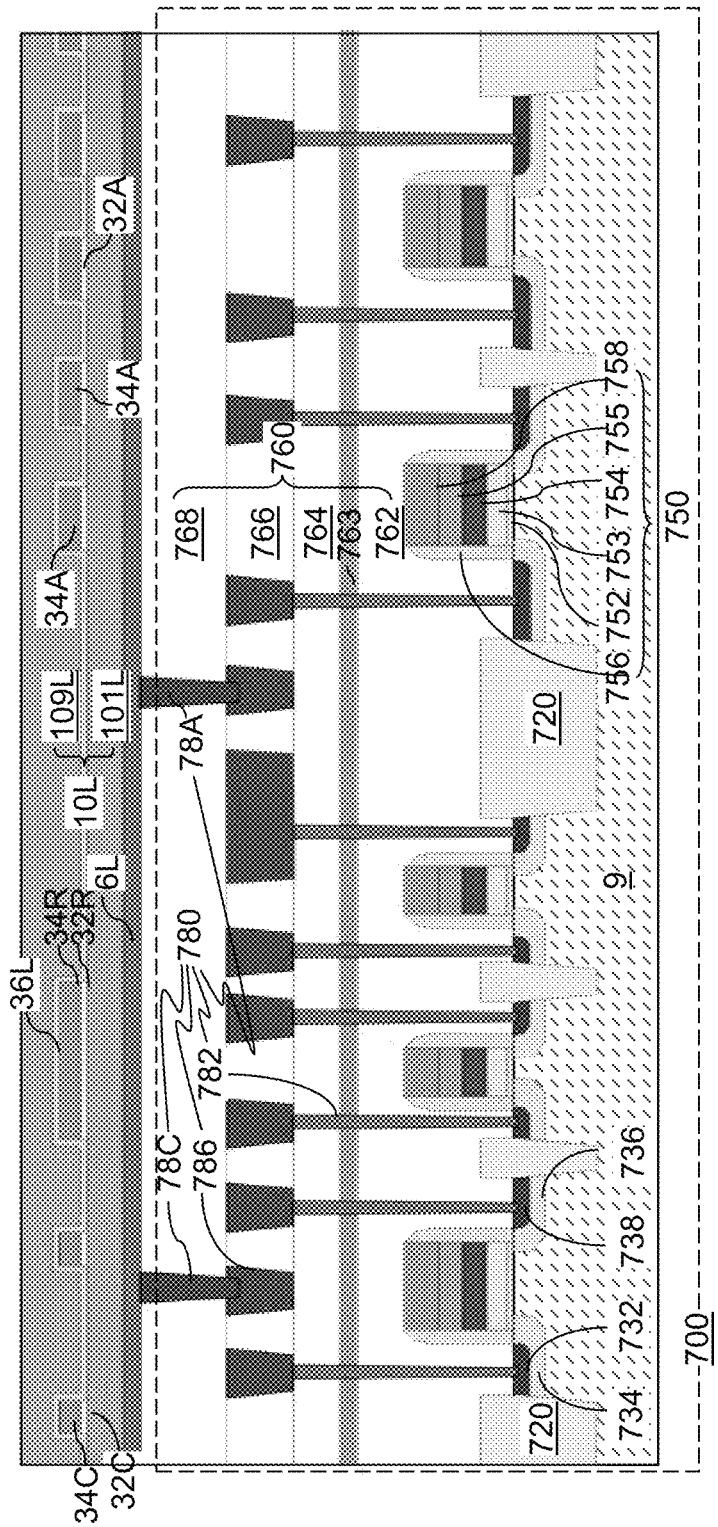
FIG. 7 is a vertical cross-sectional view of the exemplary structure after deposition of an upper semiconductor layer according to an embodiment of the present disclosure.

Referring to FIG. 7, an upper semiconductor layer 109L can be deposited over the upper dielectric layer 36L. The upper semiconductor layer 109L can include a conductive doped semiconductor material having a doping of the first conductivity type, which is the same type as the conductivity type of the lower semiconductor layer 101L. The upper semiconductor layer 109L can include doped polysilicon, doped amorphous silicon, a doped silicon-containing semiconductor alloy, a doped compound semiconductor material (such as a doped III-V compound material), or a doped organic semiconductor material. The thickness of the upper semiconductor layer 109L can be in a range from 100 nm to 600 nm (e.g., 150 to 200 nm), although lesser and greater thicknesses can also be employed. In one embodiment, the upper semiconductor layer 109L can include n-doped polysilicon. The upper semiconductor layer 109L can have a flat top surface due to the larger thickness of the upper semiconductor layer 109L compared to the underlying structures.

Optionally, the top surface of the upper semiconductor layer 109L can be planarized, for example, by a planarization process such as chemical mechanical planarization. The lower semiconductor layer 101L and the upper semiconductor layer 109L are collectively referred to as a semiconductor layer stack 10L. The lower semiconductor layer 101L and the upper semiconductor layer 109L are vertically separated from each other in each region at least by a portion of the upper dielectric layer 36L. Alternatively, a gap fill material, such as silicon oxide, can be formed between the underlying structures followed by forming a planar upper semiconductor layer 109L over the gap fill material.

Figure 8:
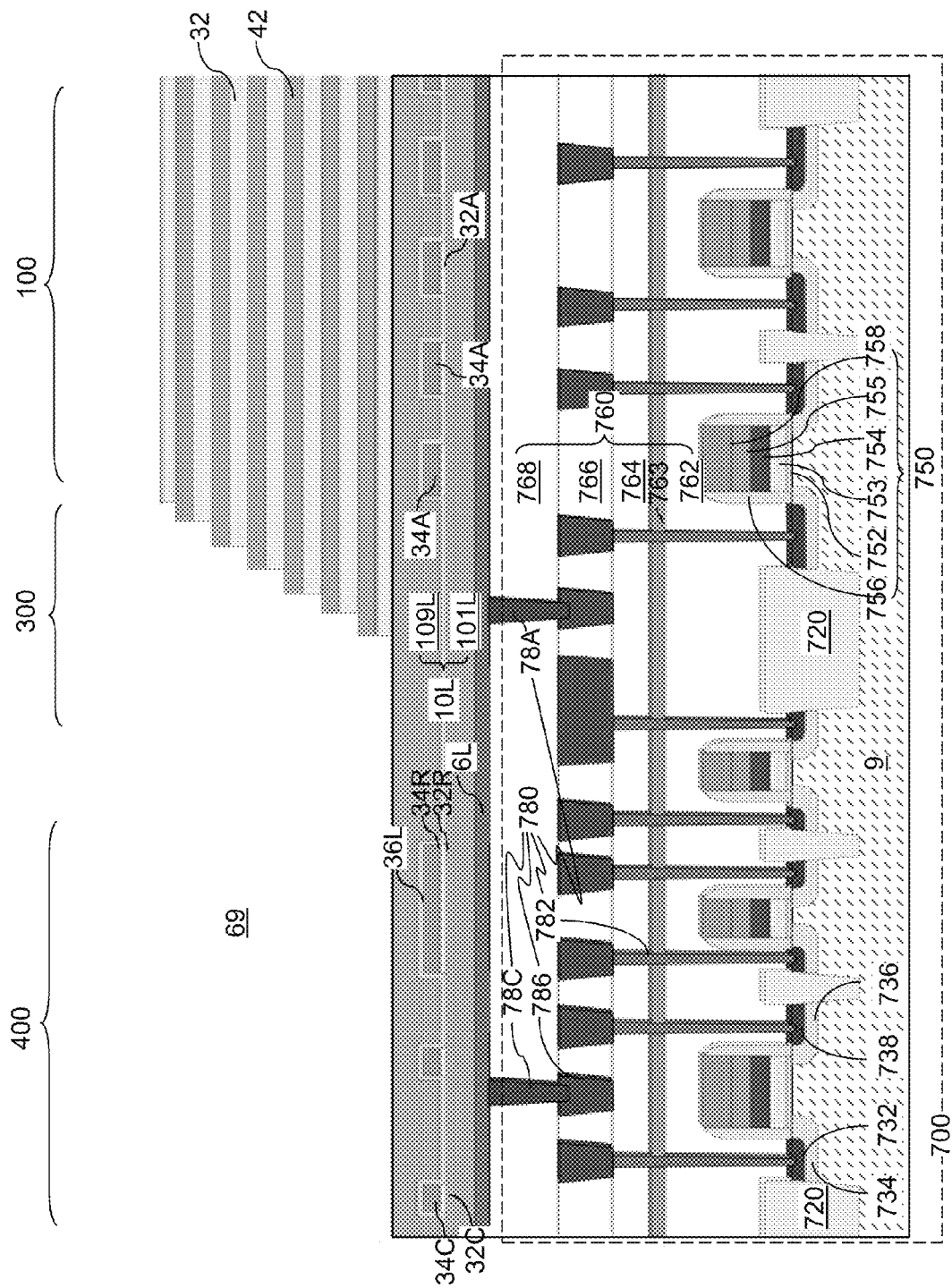
FIG. 8 is a vertical cross-sectional view of the exemplary structure after formation of an alternating stack of insulating layers and spacer material layers according to an embodiment of the present disclosure.

Referring to FIG. 8, a stack of an alternating plurality of first material layers (which can be insulating layers 32) and second material layers (which can be sacrificial material layer 42) is formed over the semiconductor layer stack 10L. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

A stepped cavity 69 can be formed within the contact region 300 and over the peripheral region 400. The stepped cavity 69 can have various stepped surfaces such that the horizontal cross-sectional shape of the stepped cavity 69 changes in steps as a function of the vertical distance from the top surface of the semiconductor layer stack 10L. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

In one embodiment, the stepped cavity 69 can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including the level of the alternating stack is defined as the relative position of a pair of a first material layer and a second material layer within the structure. The stepped surfaces can be formed in the contact region 300. The entirety of the alternating stack (32, 42) can be etched from the peripheral region 400.

A terrace region is formed in the contact region 300 by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42). Each sacrificial material layer 42 other than the topmost sacrificial material layer 42 within the alternating stack (32, 42) laterally extends farther than any overlying sacrificial material layer 42 within the alternating stack (32, 42). The stepped cavity 69 can be bounded by the physically exposed portion of the top surface of the semiconductor layer stack 10L (i.e., the top surface of the upper semiconductor layer 109L) in the peripheral region 400, and by the stepped surfaces of the alternating stack (32, 42) in the contact region 300.

Figure 9:
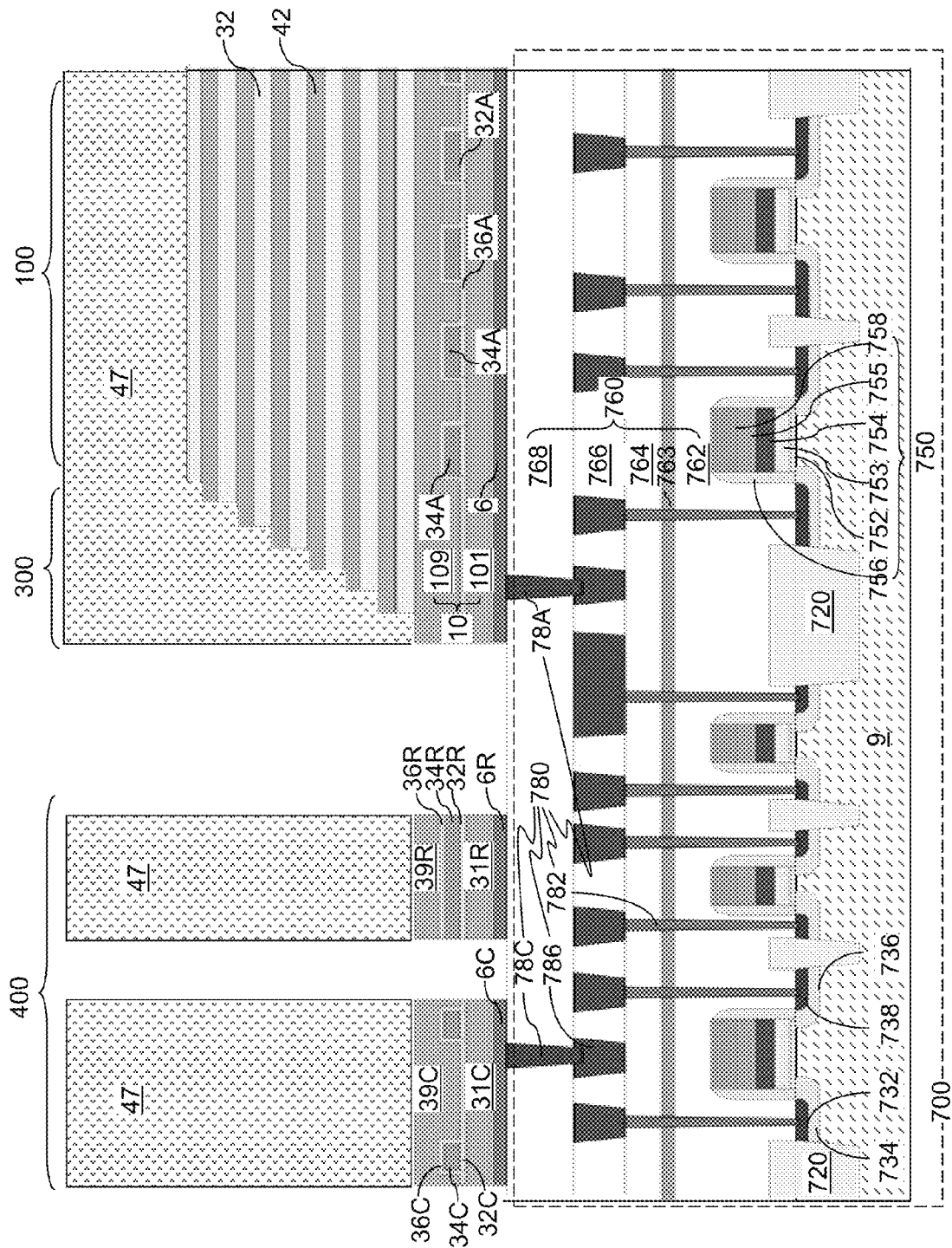
FIG. 9 is a vertical cross-sectional view of the exemplary structure after patterning of passive device structures according to an embodiment of the present disclosure.

Referring to FIG. 9, a photoresist layer 47 can be applied over the exemplary structure and can be lithographically patterned to cover the entirety of the array region 100 and the contact region 300, and to cover each area within the peripheral region 400 to be subsequently patterned into resistors or capacitors. An anisotropic etch can be performed to pattern the layer stack of the top semiconductor layer 109L, the upper dielectric layer 36L, the lower semiconductor layer 101L, and the metallic material layer 6L. If any portion of the spacer plates (34R, 34C) and dielectric liners (32R, 32C) is not covered by the photoresist layer 47, such an uncovered portion of the spacer plates (34R, 34C) and dielectric liners (32R, 32C) can be removed during the anisotropic etch. In an alternative embodiment, the etching step of FIG. 9 can precede the step of forming the alternating stack (32, 42).

Patterning of at least the upper semiconductor layer 109L, the upper dielectric layer 36L, the lower semiconductor layer 101L, and the metallic material layer 6L forms a first layer stack (6, 101, 32A, 34A, 36A, 109) in the array region 100 and the contact region 300, and second layer stacks {(6R, 31R, 32R, 34R, 36R, 39R) or (6C, 32C, 32C, 34C, 36C, 39C)} in the peripheral region 400. The first layer stack (6, 101, 32A, 34A, 36A, 109) includes a patterned metallic material layer 6 that is a remaining portion of the metallic material layer 6L, a patterned lower semiconductor layer 101 that is a remaining portion of the lower semiconductor layer 101L, a patterned upper dielectric layer 36A that is a remaining portion of the upper dielectric layer 36L, and a patterned upper semiconductor layer 109 that is a remaining portion of the upper semiconductor layer 109L. The first layer stack (6, 101, 32A, 34A, 36A, 109) further includes the array dielectric liners 32A and the spacer line structures 34A. The patterned lower semiconductor layer 101 and the patterned upper semiconductor layer 109 collectively constitute a patterned semiconductor layer stack 10.

Each of the second layer stacks {(6R, 31R, 32R, 34R, 36R, 39R) or (6C, 32C, 32C, 34C, 36C, 39C)} can include a passive device, which can be a resistor or a capacitor. The second layer stacks {(6R, 31R, 32R, 34R, 36R, 39R) or (6C, 32C, 32C, 34C, 36C, 39C)} can include resistor-type second layer stacks (6R, 31R, 32R, 34R, 36R, 39R) and capacitor-type second layer stacks (6C, 32C, 32C, 34C, 36C, 39C). Each resistor-type second layer stack (6R, 31R, 32R, 34R, 36R, 39R) includes a resistor-type metal plate 6R that is a remaining portion of the metallic material layer 6L, a resistor-type lower semiconductor plate 31R that is a remaining portion of the lower semiconductor layer 101L, an optional resistor dielectric liner 32R, an optional resistor spacer plate 34R, a resistor-type dielectric material plate 36R that is a remaining portion of the upper dielectric layer 36L, and a resistor-type upper semiconductor plate 39R that is a remaining portion of the upper semiconductor layer 109L. Each capacitor-type second layer stack (6C, 31C, 32C, 34C, 36C, 39C) includes a capacitor-type metal plate 6C that is a remaining portion of the metallic material layer 6L, a capacitor-type lower semiconductor plate 31C that is a remaining portion of the lower semiconductor layer 101L, optional capacitor dielectric liners 32C, an optional capacitor spacer plate 34C, a capacitor-type dielectric material plate 36C that is a remaining portion of the upper dielectric layer 36L, and a capacitor-type upper semiconductor plate 39C that is a remaining portion of the upper semiconductor layer 109L.

Thus, each of the passive device includes a respective second layer stack {(6R, 31R, 32R, 34R, 36R, 39R) or (6C, 32C, 32C, 34C, 36C, 39C)} includes: a lower semiconductor plate (31R or 31C) that is a patterned portion of the lower semiconductor layer 101L; a dielectric material plate (36R or 36C) that is a patterned portion of the upper dielectric layer 36L; and an upper semiconductor plate (39R or 39C) that is a patterned portion of the upper semiconductor layer 109L. At least one of the passive devices can include a resistor, and at least another of the passive devices can include a capacitor. For each of the passive devices, the lower semiconductor plate (31R or 31C) can be vertically spaced from the semiconductor substrate 9 by the same distance as the patterned lower semiconductor layer 101 is from the substrate 9. The dielectric material plate (36R or 36C) can be vertically spaced from the substrate by the same distance as the patterned dielectric material layer 36A is from the semiconductor substrate 9. An upper semiconductor plate (39R or 39C) can be vertically spaced from the semiconductor substrate 9 by the same distance as the patterned upper semiconductor layer 109 is from the semiconductor substrate 9.

For each of the passive devices, the lower semiconductor plate (31R or 31C) can have the same composition as, and the same thickness as, the patterned lower semiconductor layer 101. The dielectric material plate (36R or 36C) can have the same composition as, and the same thickness as, the patterned dielectric material layer 36A. The upper semiconductor plate (39R or 39C) can have the same composition as the patterned upper semiconductor layer 109.

Figure 10A:
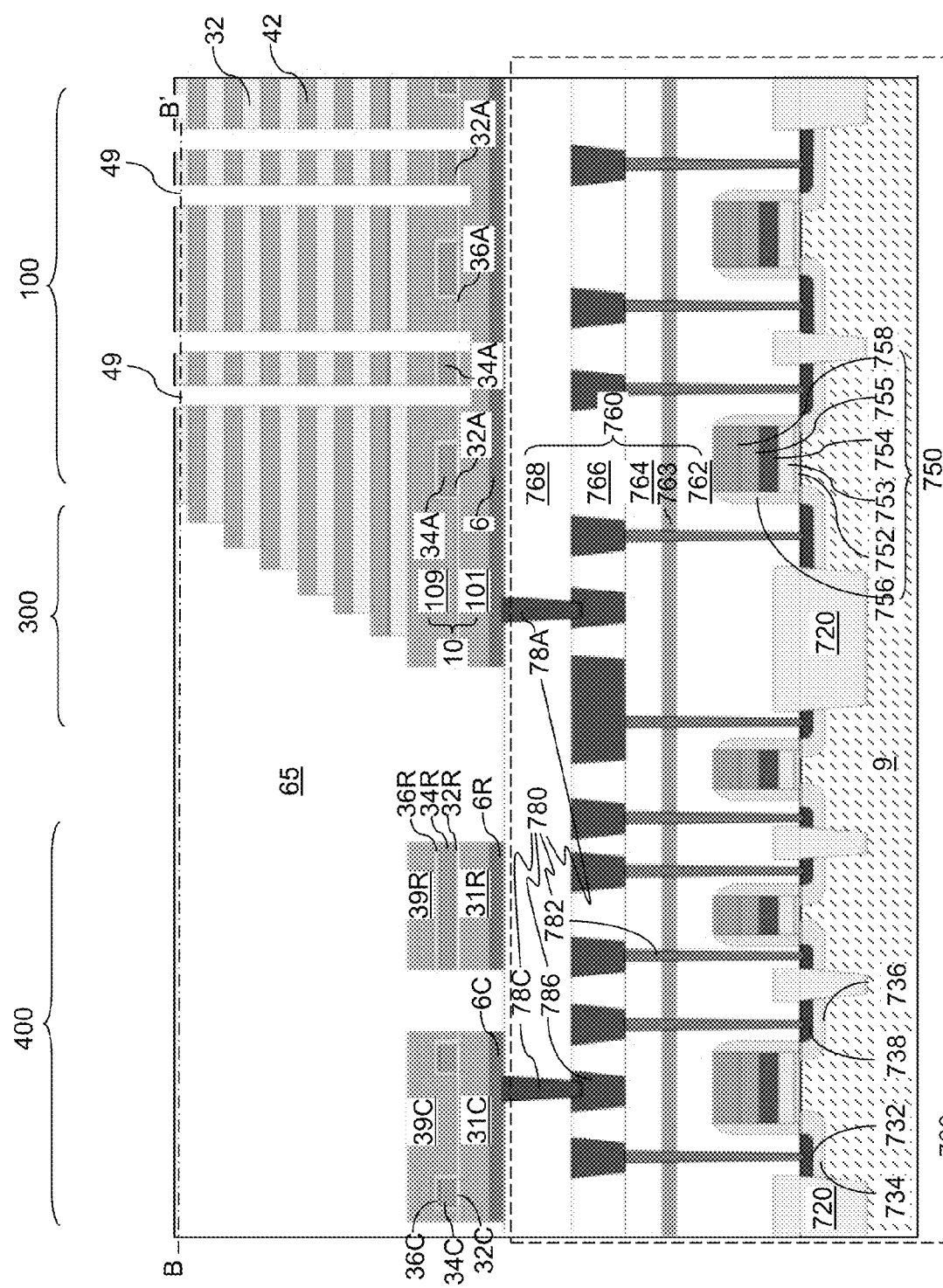
FIG. 10A is a vertical cross-sectional view of the exemplary structure after formation of a retro-stepped dielectric material layer, memory openings, and support openings according to an embodiment of the present disclosure.
Figure 10B:
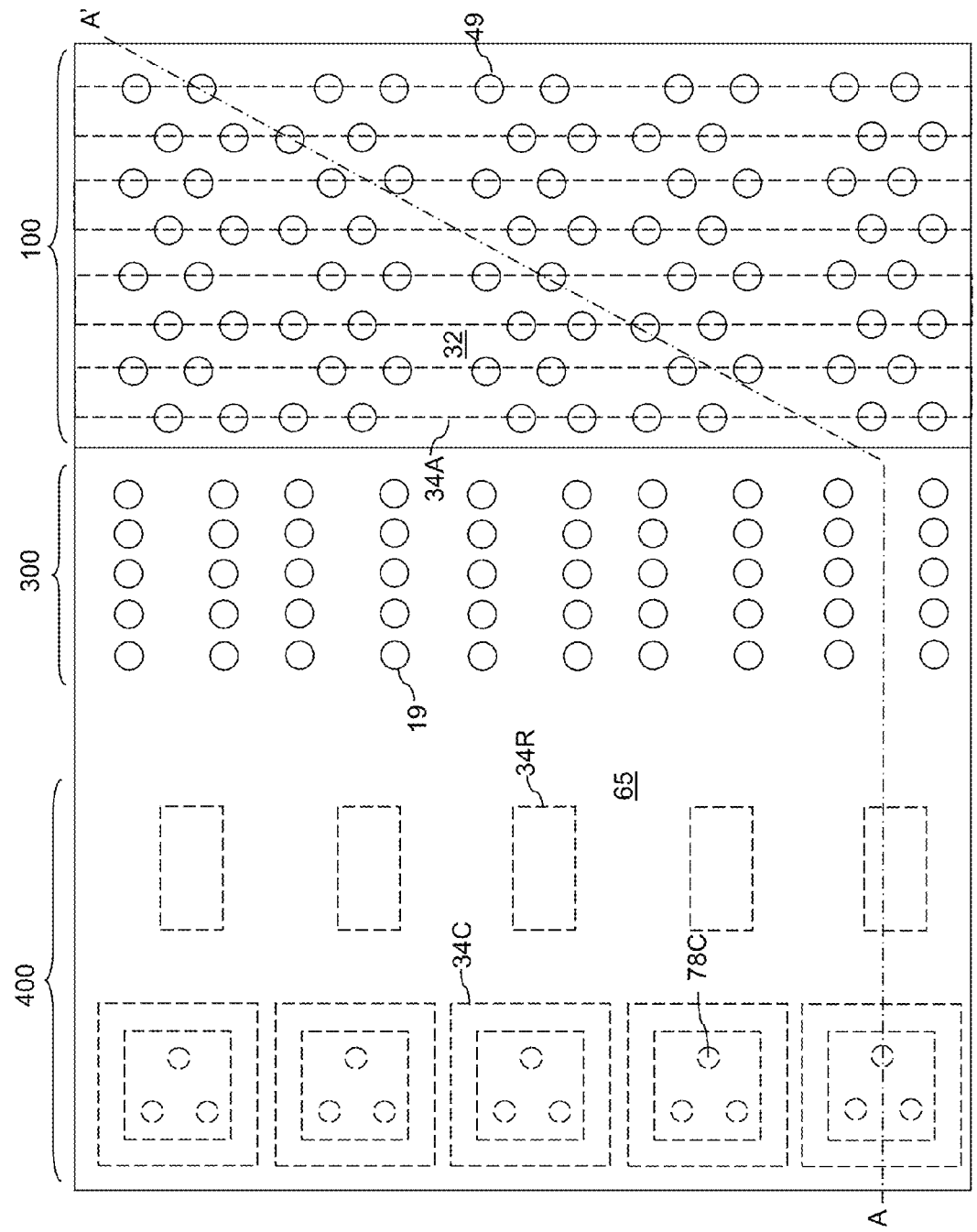
FIG. 10B is a horizontal cross-sectional view of the exemplary structure along the horizontal plane B-B' in FIG. 10A. The zig-zag vertical plane A-A' corresponds to the plane of the vertical cross-sectional view of FIG. 10A.

Referring to FIGS. 10A and 10B, the photoresist layer 47 can be removed selective to the underlying structures by ashing. A retro-stepped dielectric material portion 65 (i.e., an insulating fill material portion) can be formed in the stepped cavity 69 by deposition of a dielectric material therein. For example, a dielectric material such as silicon oxide can be deposited in the stepped cavity 69. Excess portions of the deposited dielectric material can be removed from above the topmost surface of the alternating stack (32, 42), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Subsequently, a lithographic material stack (not shown) including at least a photoresist layer can be formed over the alternating stack (32, 42) and the retro-stepped dielectric material portion 65, and can be lithographically patterned to form openings therein. The openings include a first set of openings formed over the array region 100 and a second set of openings formed over the contact region 300. The pattern in the lithographic material stack can be transferred through the retro-stepped dielectric material portion 65 and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the entirety of the alternating stack (32, 42) in the array region 100. The support openings 19 shown in FIG. 10B are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to the patterned bottom semiconductor layer 101 in the patterned semiconductor layer stack 10. The bottom surfaces of the memory openings 49 and the support openings 19 can be vertically offset from the top surface of the patterned bottom semiconductor layer by a recess depth. The recess depth can be, for example, in a range from 0 nm to 50 nm, although lesser and greater recess depths can also be employed.

Each of the memory openings 49 and the support openings 19 may include a sidewall (or a plurality of sidewalls) that extends substantially perpendicular to the topmost surface of the semiconductor substrate 9. A two-dimensional array of memory openings 49 can be formed in the array region 100. A two-dimensional array of support openings 19 can be formed in the contact region 300. The lithographic material stack can be subsequently removed, for example, by ashing.

FIGS. 11A-11H illustrate structural changes in a memory opening 49, which is one of the memory openings 49 in the exemplary structure of FIGS. 10A and 10B. The same structural change occurs simultaneously in each of the other memory openings 49 and in each support opening 19.

Referring to FIG. 11A, a memory opening 49 in the exemplary device structure of FIGS. 11A and 11B is illustrated. The memory opening 49 extends through the alternating stack (32, 42), the patterned upper semiconductor layer 109, and optionally into an upper portion of the semiconductor material layer 101. At this processing step, each support opening 19 can extend through the retro-stepped dielectric material portion 65, a subset of layers in the alternating stack (32, 42), the patterned upper semiconductor layer 109, the patterned upper dielectric layer 36A, a peripheral portion of a respective spacer line structures 34A, and a peripheral portion of a respective array dielectric liner 32A, and into an upper portion of the patterned lower dielectric layer 101. A sidewall of a remaining portion of a spacer line structure 34A is physically exposed within each memory opening 49. Thus, each spacer line structure 34A includes a set of lateral indentations in regions of overlap with the memory openings 49. The recess depth of the bottom surface of each memory opening 49 with respect to the top surface of the patterned lower semiconductor layer 101 can be in a range from 0 nm to 50 nm, although greater recess depths can also be employed.

Referring to FIG. 11B, a stack of layers including a blocking dielectric layer 52, a charge storage layer 54, a tunneling dielectric layer 56, and a semiconductor channel layer 60L can be sequentially deposited in the memory openings 49 and in the support openings 19.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. A memory cavity 49' is formed in the volume of each memory opening 49 that is not filled with the deposited material layers (52, 54, 56, 60L).

Referring to FIG. 11C, a dielectric material such as silicon oxide can be deposited in each memory cavity 49' and over the semiconductor channel layer 60L. The portions of the deposited dielectric material, the semiconductor channel layer 60L, the tunneling dielectric layer 56, the charge storage layer 54, the blocking dielectric layer 52 that located above the topmost surface of the alternating stack (32, 42) can be removed by a planarization process. The planarization process can employ chemical mechanical planarization (CMP) and/or at least one recess etch process. Each remaining portion of the deposited dielectric material constitutes a dielectric core 62. Each remaining portion of the semiconductor channel layer 60L constitutes a vertical semiconductor channel 60, which includes a vertical semiconductor channel that extends at least from the level of the bottom surface of the spacer line structures 34A to the level of the topmost surface of the alternating stack (32, 42). Each remaining portion of the tunneling dielectric layer 56, the charge storage layer 54, and the blocking dielectric layer 52 can be located entirely within a respective memory opening 49.

Each contiguous set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. Electrical current can flow through a vertical semiconductor channel 60 when a vertical NAND device including the vertical semiconductor channel 60 is turned on. A tunneling dielectric layer 56 is surrounded by a charge storage layer 54, and laterally surrounds a portion of the vertical semiconductor channel 60. The memory film 50 can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 11D, the top surface of each dielectric core 62 can be further recessed within each memory opening 49, for example, by a recess etch. Drain regions 63 can be formed by depositing a doped semiconductor material within each recessed region above the dielectric cores 62. The drain regions 63 can have a doping of the first conductivity type, i.e., the same conductivity type as the patterned semiconductor layer stack (101, 109). The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the topmost surface of the alternating stack (32, 42), for example, by chemical mechanical planarization (CMP) or a recess etch to form the drain regions 63.

Figure 12:
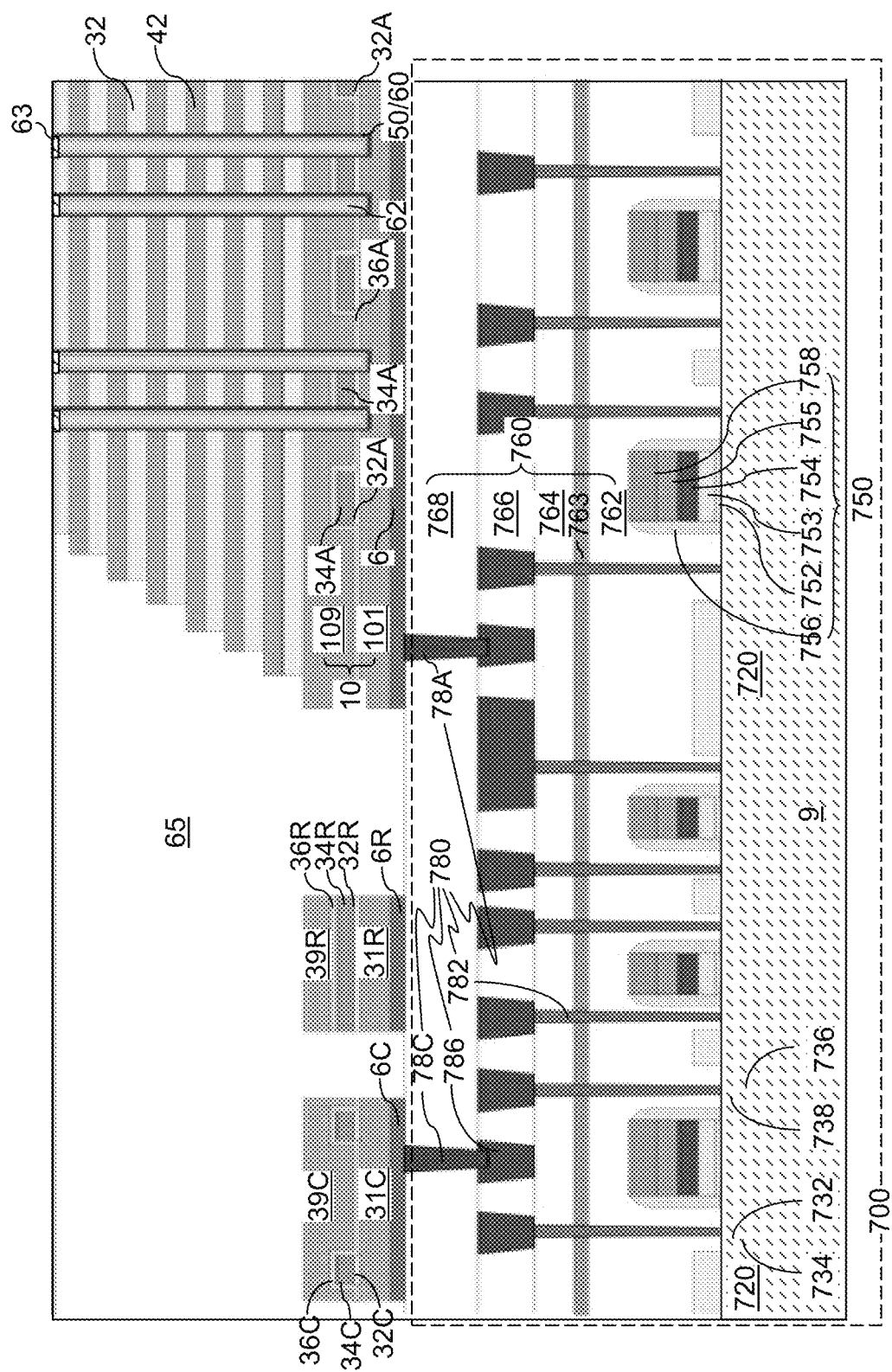
FIG. 12 is a schematic vertical cross-sectional view of the exemplary structure after formation of memory stack structures according to an embodiment of the present disclosure.

FIG. 12 illustrates the exemplary structure after the processing steps of FIG. 11D. Each combination of a memory film 50 and a vertical semiconductor channel 60 (which is a vertical semiconductor channel) within a memory opening 49 constitutes a memory stack structure (50, 60). The memory stack structure (50, 60) is a combination of a semiconductor channel, a tunneling dielectric layer, a plurality of memory elements as embodied as portions of the charge storage layer 54, and an optional blocking dielectric layer 52. Each combination of a memory stack structure (50, 60), a dielectric core 62, and a drain region 63 within a memory opening 49 is herein referred to as a memory opening fill structure (50, 60, 62, 63). Each combination of a memory film 50, a vertical semiconductor channel 60, a dielectric core 62, and a drain region 63 within each support opening 19 fills the respective support openings 19, and constitutes a support pillar structure. Thus, an instance of a memory opening fill structure (50, 60, 62, 63) can be formed within each memory opening 49 of the structure of FIGS. 10A and 10B. An instance of the support pillar structure can be formed within each support opening 19 of the structure of FIG. 10B.

Each memory stack structure (50, 60) includes a vertical semiconductor channel 60 and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a charge storage layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 13A:
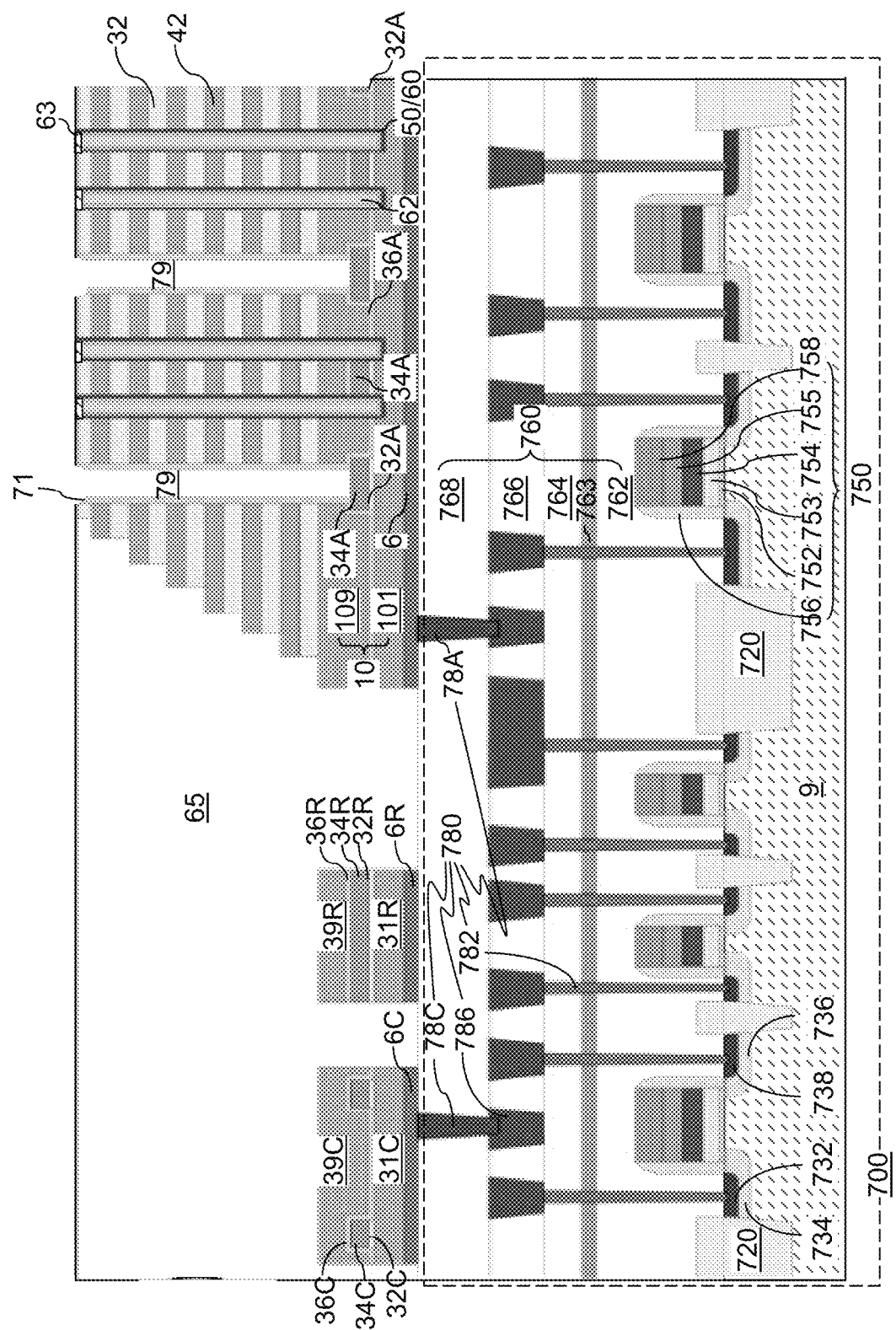
FIG. 13A is a schematic vertical cross-sectional view of the exemplary structure after formation of backside trenches and sacrificial spacers according to an embodiment of the present disclosure.
Figure 13B:
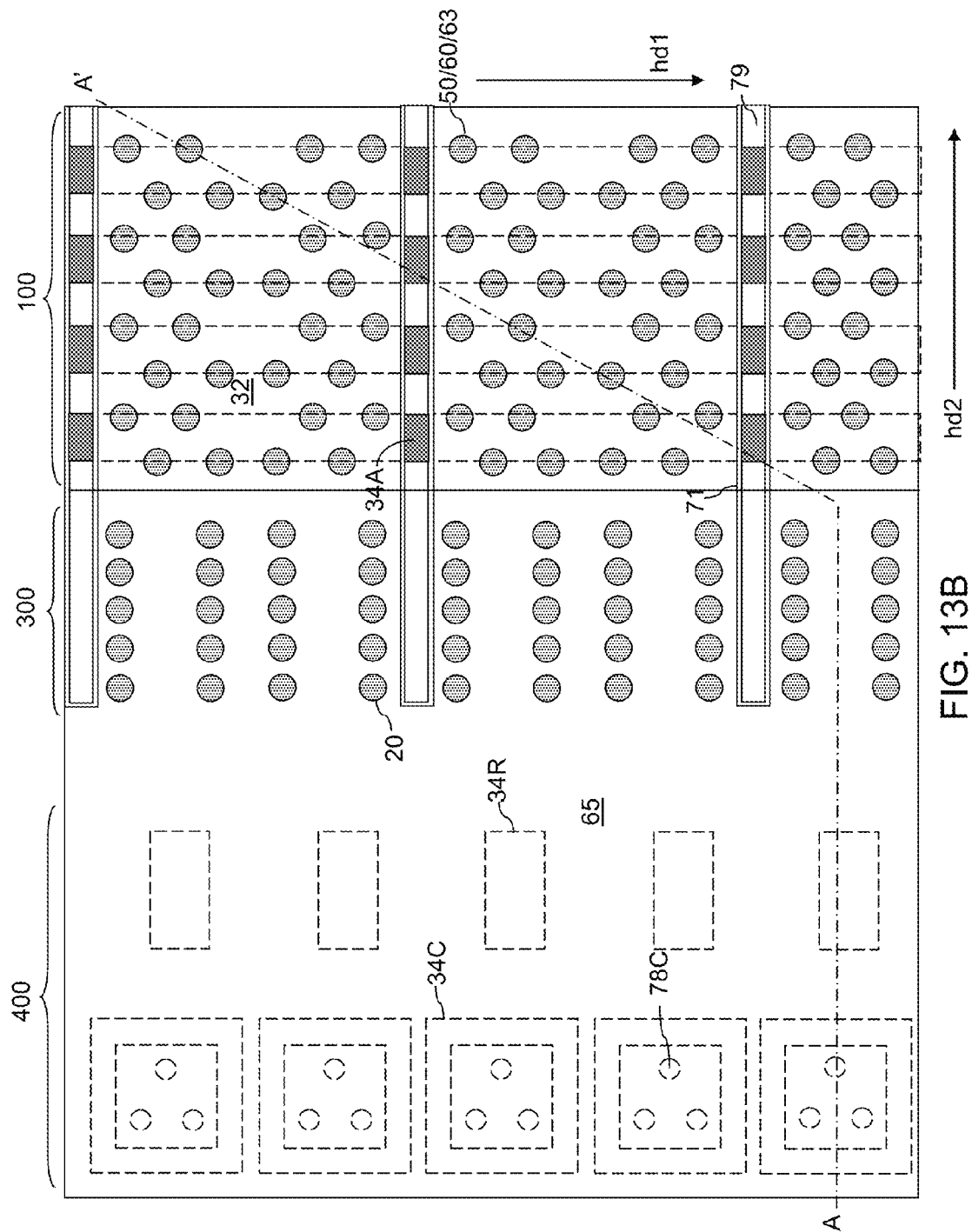
FIG. 13B is a partial see-through top-down view of the exemplary structure of FIG. 13A. The vertical plane A-A' is the plane of the schematic vertical cross-sectional view of FIG. 13A.

Referring to FIGS. 13A and 13B, a photoresist layer (not shown) can be applied over the alternating stack (32, 42), and can be lithographically patterned to form openings in areas between clusters of memory stack structures (50, 60) and support pillar structures 20. The pattern in the photoresist layer can be transferred through the alternating stack (32, 42), the retro-stepped dielectric material portion 65, and through the patterned upper semiconductor layer 109 employing an anisotropic etch to form backside trenches 79. The backside trenches 79 vertically extend from the top surface of the alternating stack to the top surface of the spacer line structures 34A, and laterally extend through the array region 100 and the contact region 300. The backside trenches 79 laterally extend along a different direction than the lengthwise direction of the spacer line structures 34A. Thus, each backside trench 79 can straddle multiple spacer line structures 34A. In one embodiment, the backside trenches 79 can laterally extend along the second horizontal direction hd2 that is perpendicular to the lengthwise direction of the spacer line structures 34A, i.e., the first horizontal direction hd1.

A sacrificial spacer 71 can be formed on the sidewalls of the backside trenches 79. The sacrificial spacer 71 can include a material that can protect the insulating layers 32 and the sacrificial material layers 42 during a subsequent etch process that removes the spacer line structures 34A. For example, if the sacrificial material layers 42 and the spacer line structures 34A include silicon nitride, the sacrificial spacer 71 can include a silicon oxide material that can protect the sacrificial material layers 42 during subsequent removal of the spacer line structures 34A. The sacrificial spacer 71 can be formed by depositing a conformal layer of a sacrificial material that is different from the material of the spacer line structures 34A, and by removing horizontal portions of the conformal layer by an anisotropic etch. Each remaining vertical portion of the conformal layer constitutes the sacrificial spacer 71. The sacrificial spacer 71 can cover the entirety of the sidewalls of each backside trench 79. The thickness of the sacrificial spacer 71 can be in a range from 3 nm to 60 nm, although lesser and greater thicknesses can also be employed.

Figure 14:
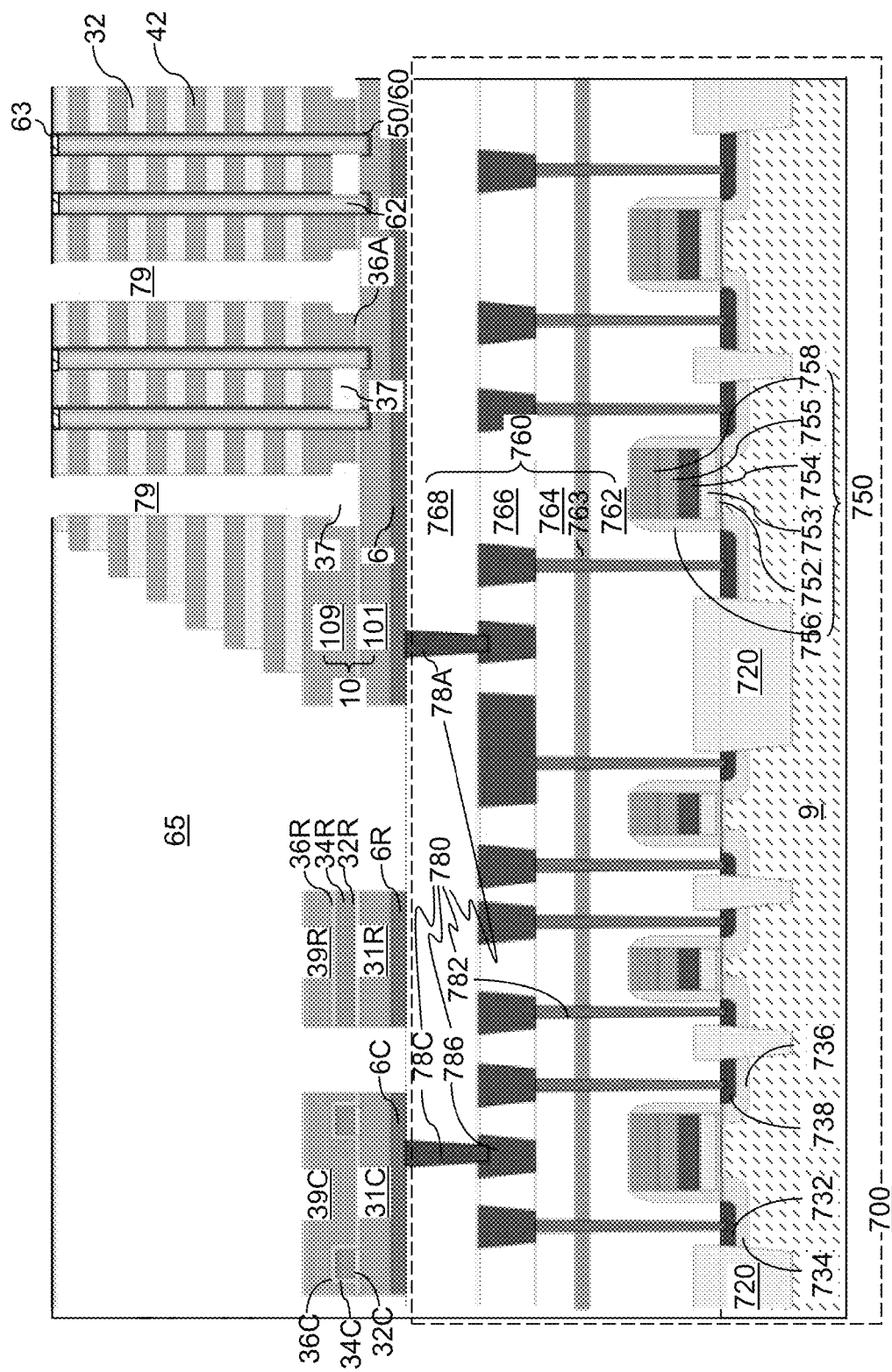
FIG. 14 is a schematic vertical cross-sectional view of the exemplary structure after formation of line cavities by removal of spacer line structures according to an embodiment of the present disclosure.

Referring to FIG. 14, line cavities 37 can be formed by removing the spacer line structures 34A. The process of formation of the line cavities 37 is illustrated in FIGS. 15A-15D.

Figure 15A:
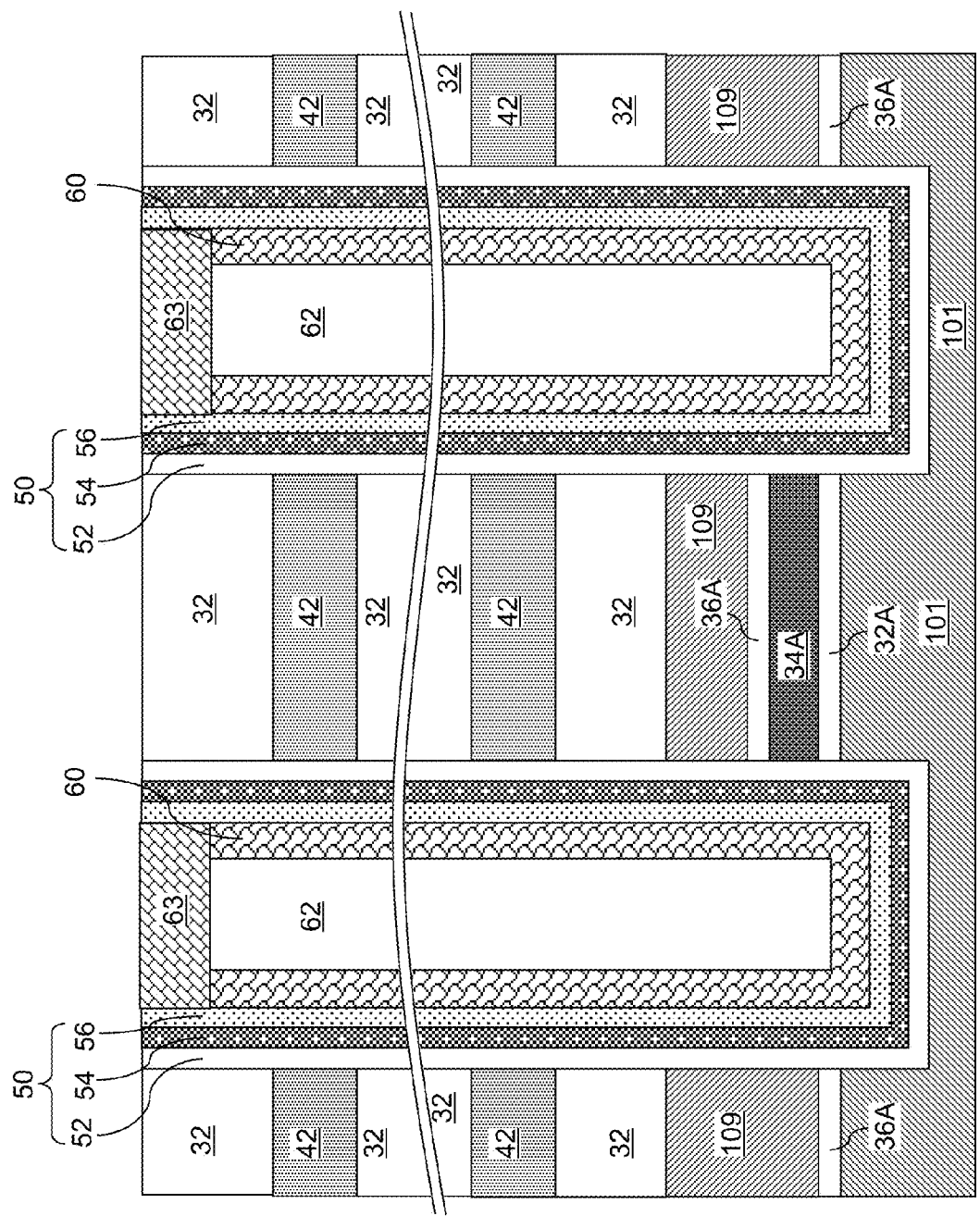
FIGS. 15A-15D are sequential schematic vertical cross-sectional views of a pair of memory openings during formation of a line cavity according to an embodiment of the present disclosure.

Referring to FIG. 15A, a region of the exemplary structure including a neighboring pair of memory stack structures (50, 60) and a spacer line structure 34A therebetween at the processing steps of FIGS. 13A and 13B, i.e., prior to removal of the spacer line structures 34A.

Figure 15B:
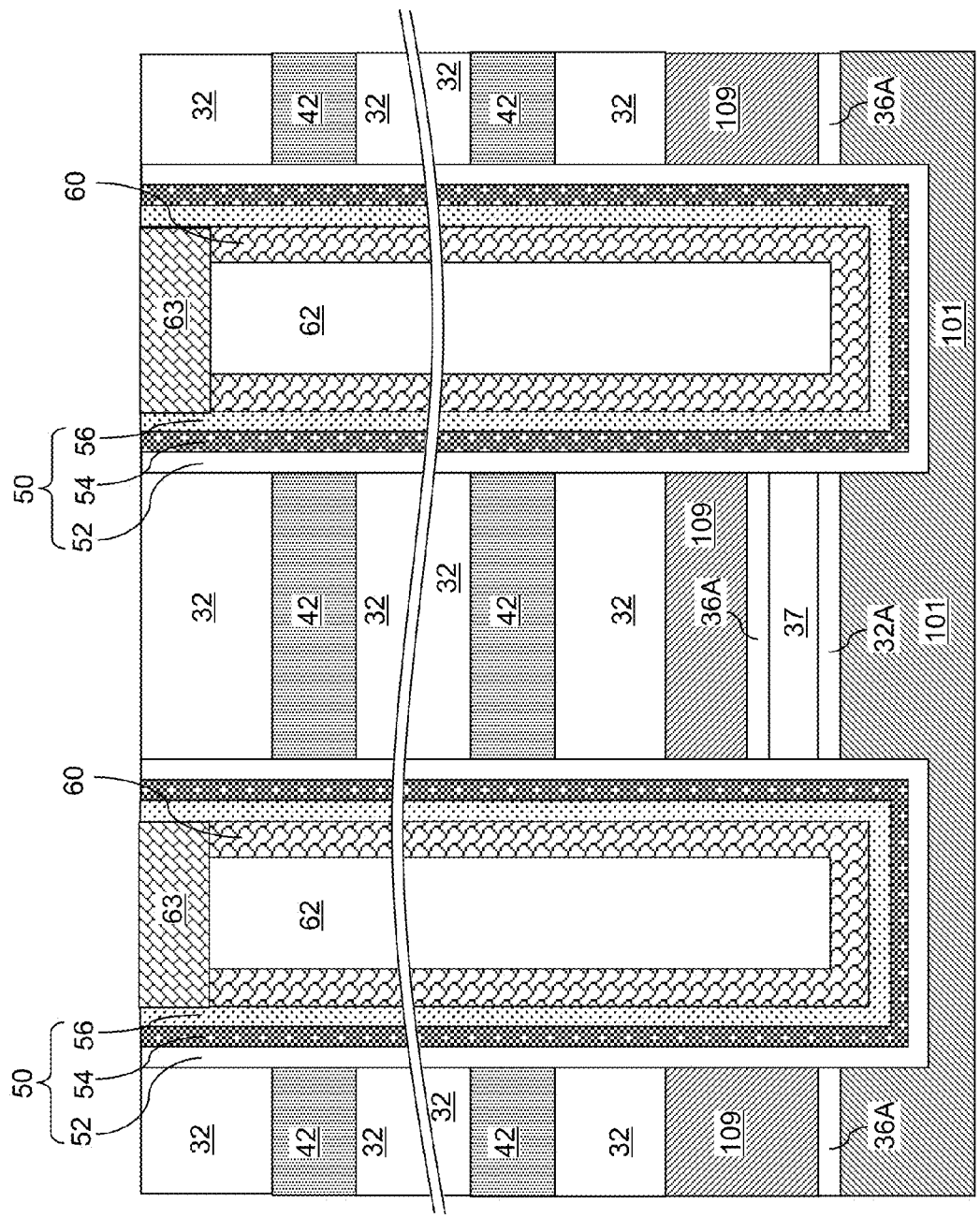

Referring to FIG. 15B, removal of the spacer line structures 34A can be performed selective to the retro-stepped dielectric material portion 65, the sacrificial spacer 71, the patterned upper dielectric layer 36A, and the array dielectric liners 32A. For example, if the spacer line structures 34A includes silicon nitride, and if the retro-stepped dielectric material portion 65, the sacrificial spacer 71, the patterned upper dielectric layer 36A, and the array dielectric liners 32A include doped or undoped silicate glass (i.e., silicon oxide), removal of the spacer line structures 34A can be performed by a wet etch employing hot phosphoric acid provided through the backside trenches 79. In one embodiment, removal of the spacer line structures 34A can be selective to the blocking dielectric layers 52. For example, if the blocking dielectric layers 52 include silicon oxide and if the spacer line structures 34A include silicon nitride, the spacer line structures 34A can be removed by a wet etch employing hot phosphoric acid without etching the blocking dielectric layers 52.

Figure 15C:
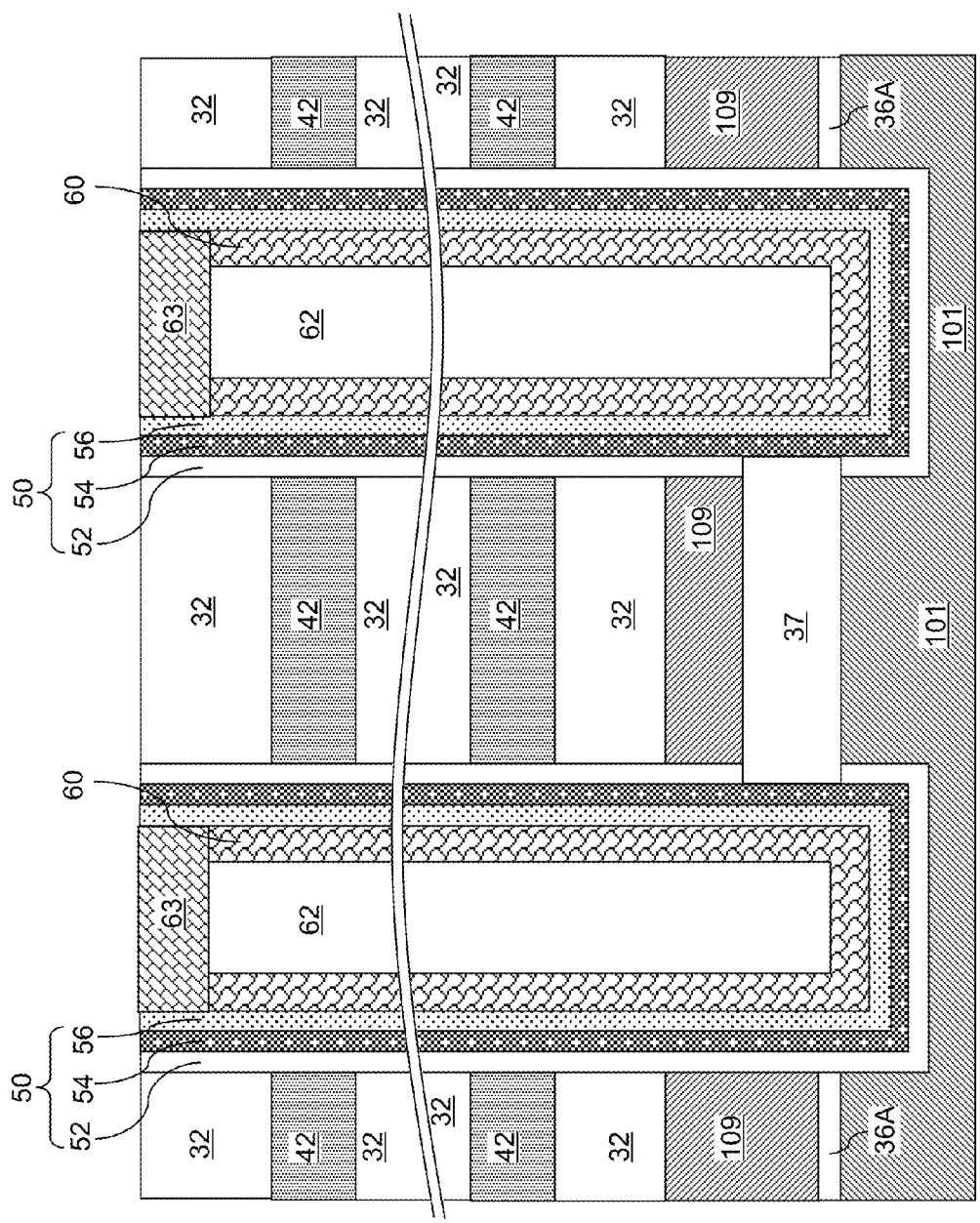

Referring to FIG. 15C, another isotropic etch process can be performed to remove the physically exposed portions of the blocking dielectric layers 52 around the line cavities 37, the array dielectric lines 32A, and physically exposed portions of the patterned upper dielectric layer 36A that overlie the line cavities 37. For example, if the blocking dielectric layers 52, the array dielectric liners 32A, and the patterned upper dielectric layer 36A includes silicon oxide, a wet etch employing hydrofluoric acid can be employed to etch the blocking dielectric layers 52, the array dielectric liners 32A, and the patterned upper dielectric layer 36A, thereby laterally and vertically expanding each lie cavity 37. A lower portion of the outer surface of each charge storage layer 54 can be physically exposed for each memory film 50. The sacrificial spacer 71 may be partially or completely removed during the isotropic etch process at this processing step.

Figure 15D:
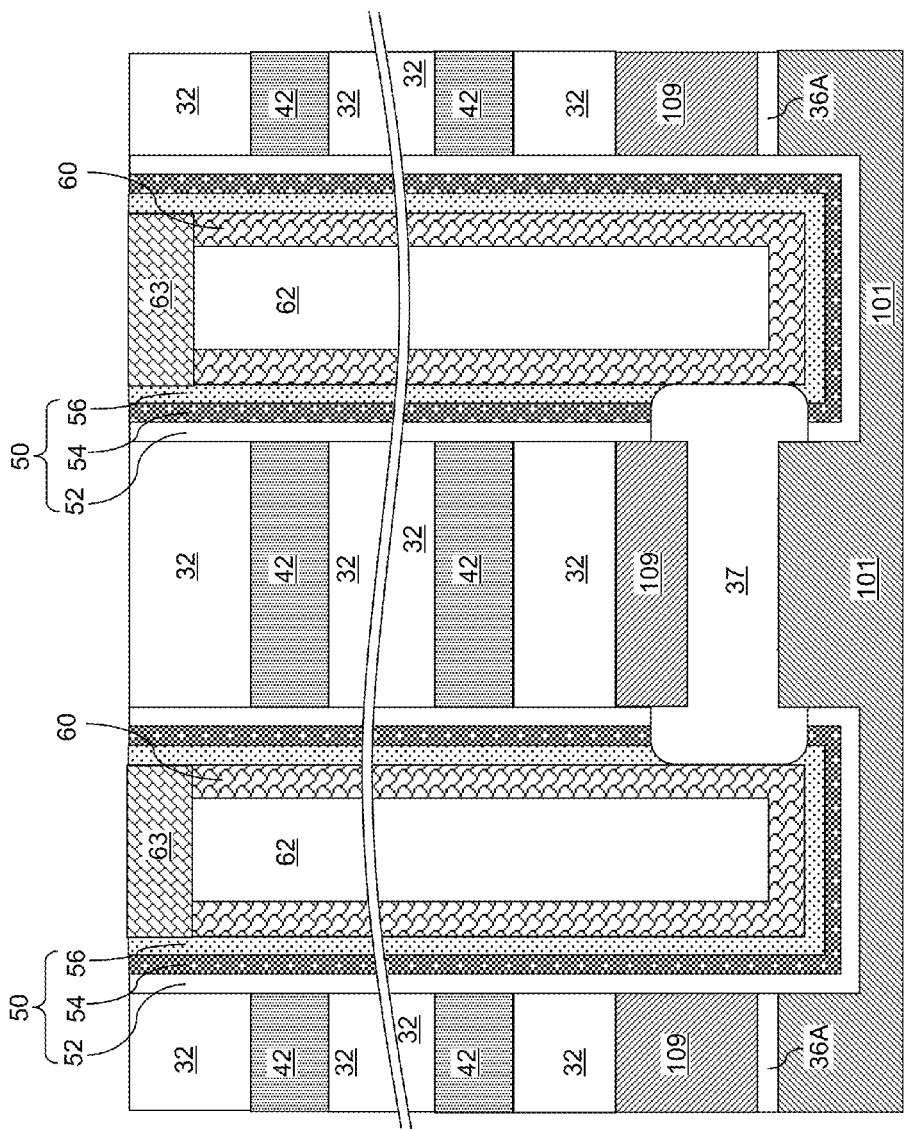

Referring to FIG. 15D, a series of isotropic etch processes can be performed to sequentially etch the physically exposed portions of the charge storage layers 54 and the tunneling dielectric layers 56. For example, if the charge storage layers 54 include silicon nitride, a wet etch employing hot phosphoric acid can be employed to remove the physically exposed portions of the charge storage layers 54. If the tunneling dielectric layers include silicon oxide or silicon oxynitride, a wet etch employing hydrofluoric acid can be employed to remove the physically exposed portions of the tunneling dielectric layer 56. A lower portion of the outer sidewall of each vertical semiconductor channel can be physically exposed to a respective line cavity 37. Due to the isotropic nature of the etch processes, the height of terminal portions of each line cavity 37 formed by removal of portions of the memory films 50 can have a greater height than a continuously extending central portion of each line cavity 37 that is vertically bounded by the patterned lower semiconductor layer 101 and the patterned upper semiconductor layer 109.

Each of the memory stack structures (50, 60) includes a respective vertical semiconductor channel 60 and a respective memory film 50 that laterally surrounds the respective vertical semiconductor channel 60. Portions of the memory films 50 around the line cavities 37 are removed to physically expose a lower portion of an outer sidewall of each vertical semiconductor channel 60 while the line cavities 37 are laterally expanded.

Figure 16A:
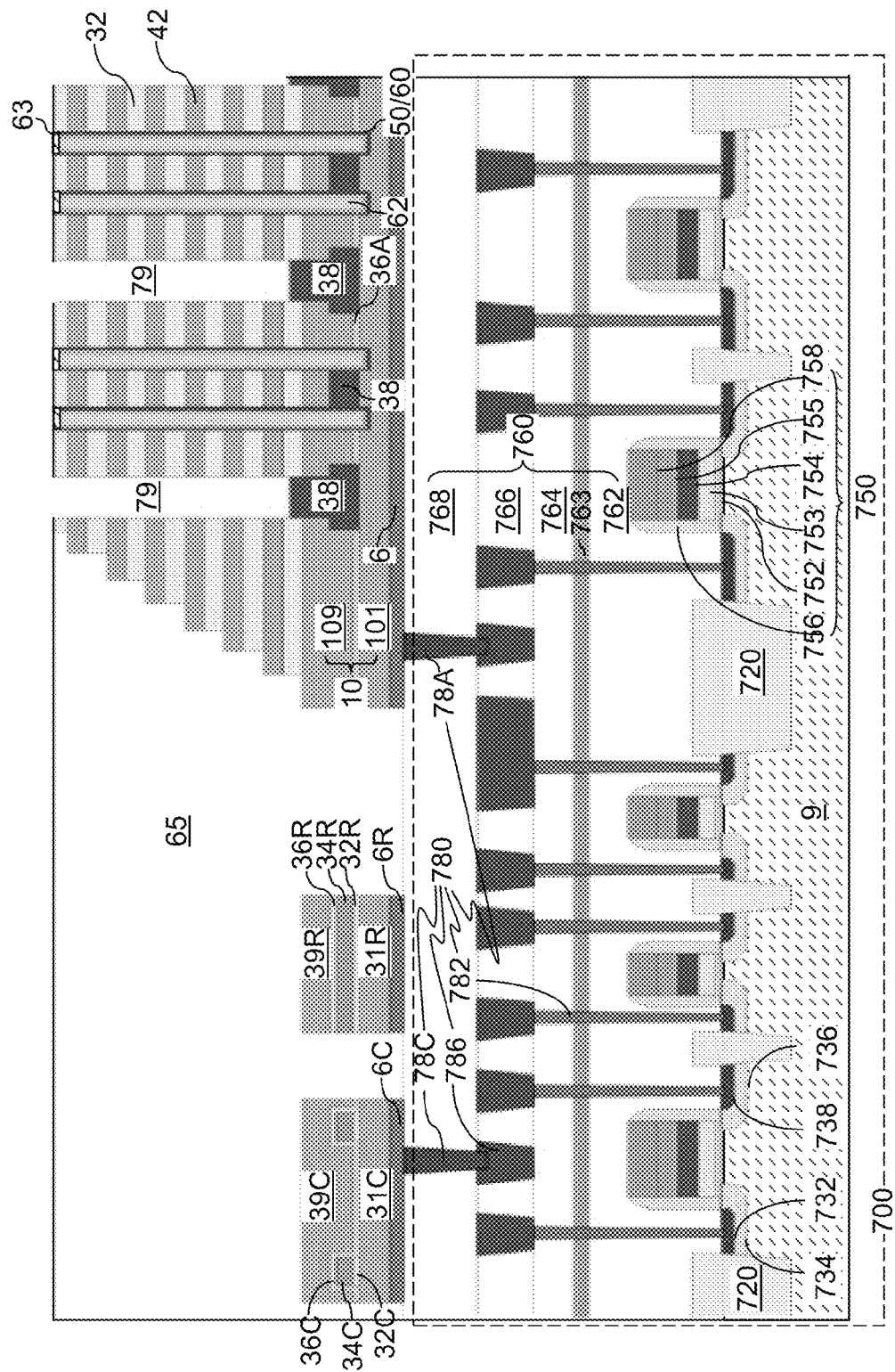
FIG. 16A is a schematic vertical cross-sectional view of the exemplary structure after formation of a continuous semiconductor structure including semiconductor line structures and semiconductor rails according to an embodiment of the present disclosure.
Figure 16B:
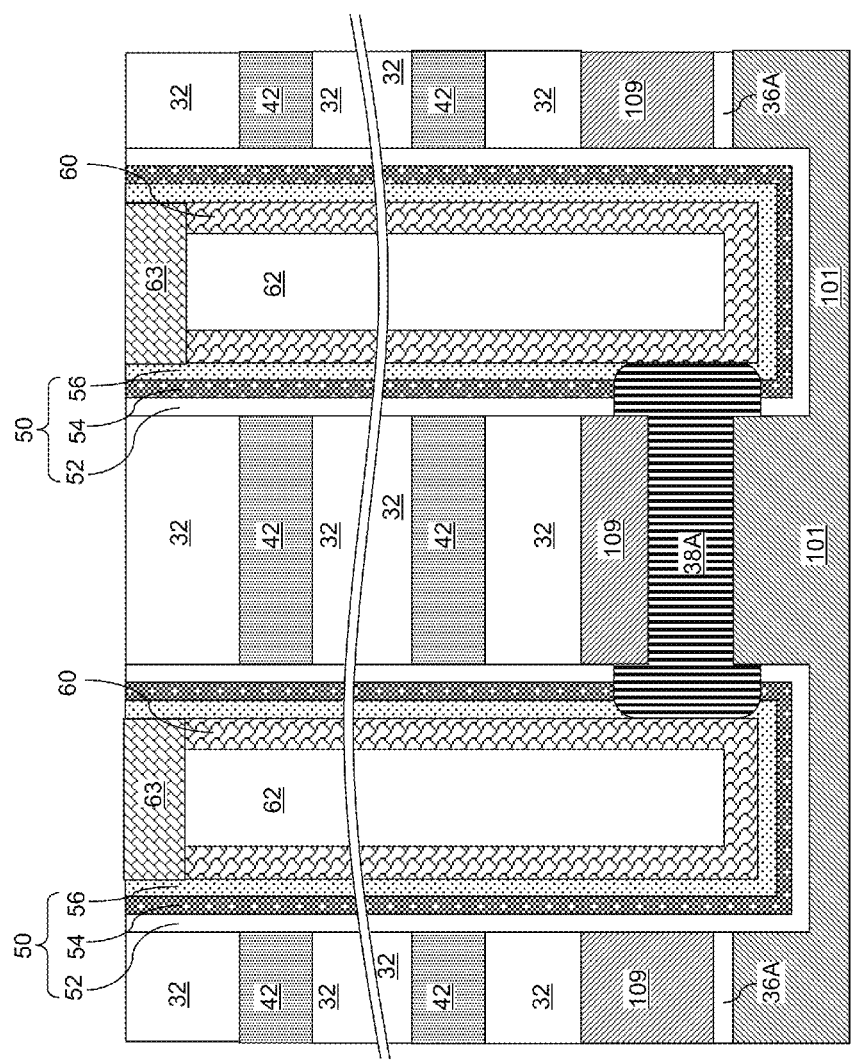
FIG. 16B is a schematic vertical cross-sectional views of a pair of memory openings after formation of a semiconductor line structure according to an embodiment of the present disclosure.
Figure 16C:
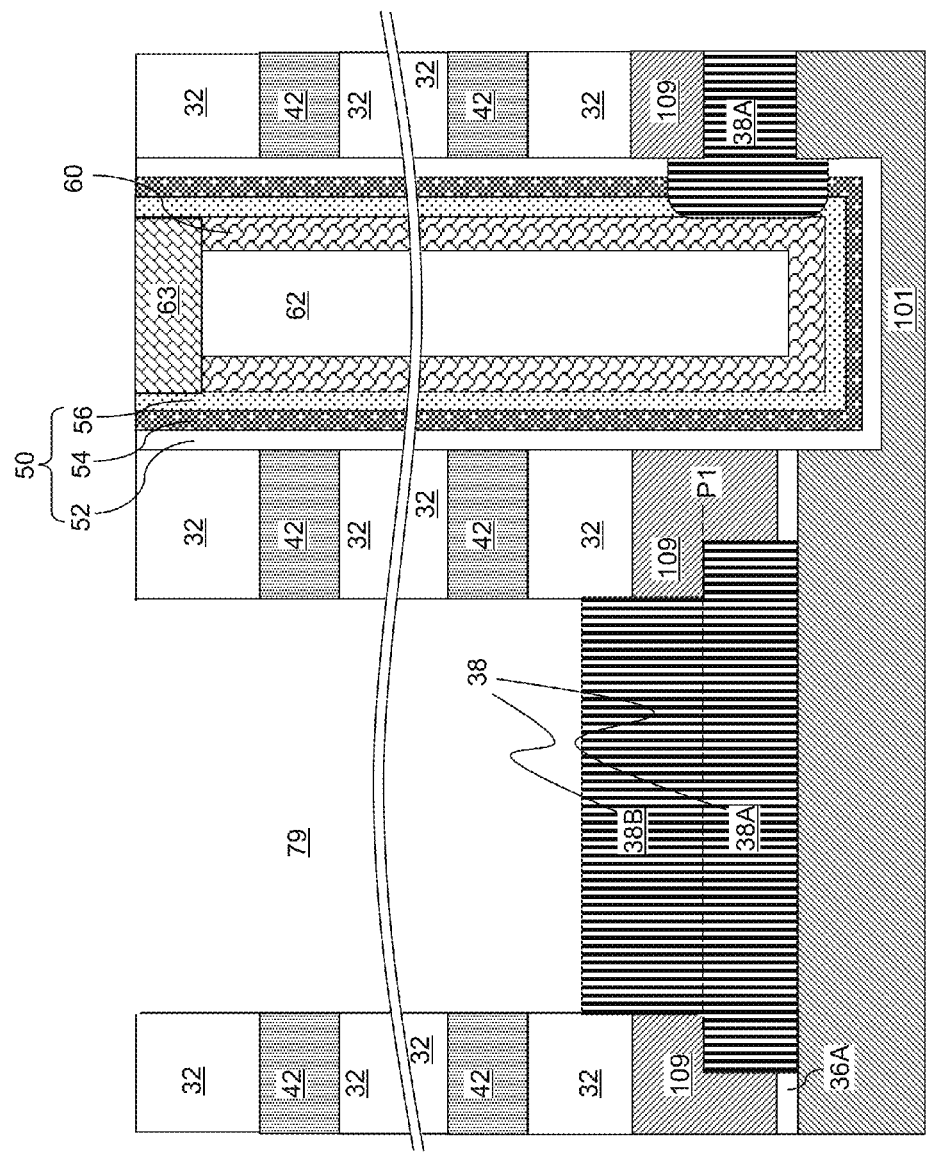
FIG. 16C is a schematic vertical cross-sectional views of a memory opening and a backside trench after formation of a semiconductor line structure and a semiconductor rail according to an embodiment of the present disclosure.

Referring to FIGS. 16A-16C, a continuous semiconductor structure 38 including semiconductor line structures 38A and semiconductor rails 38B can be formed in the line cavities 37 and lower portions of the backside trenches 79. A selective semiconductor deposition process, such as selective epitaxy, can be performed to deposit a conductive semiconductor material (i.e., a semiconductor material having electrical conductivity greater than $1.0 \times 10^5$ S/cm) on the physically exposed semiconductor surfaces, while the semiconductor material does not grow from dielectric surfaces such as the surfaces of the alternating stack (32, 42) and the retro-stepped dielectric material portion 65. In an illustrative example, a reactant such as silane, disilane, dichlorosilane, trichlorosilane, silicon tetrachloride, germane, digermane, or a combination thereof can be flowed into a process chamber concurrently, or alternately, with flow of an etchant gas such as hydrogen chloride. The flow rate of the etchant can be set at a level that is greater than the nucleation rate on the dielectric surfaces and less than the deposition rate on the semiconductor surfaces to enable the selective deposition of the semiconductor material.

The semiconductor line structures 38A of the continuous semiconductor structure 38 are formed in the volumes of line cavities 37. A top surface of each semiconductor line structure 38A physically contacts a raised bottom surface of the patterned upper semiconductor layer 109; a bottom surface of each semiconductor line structure 38A physically contacts a top surface of the patterned lower semiconductor layer 101; and sidewall surfaces of each semiconductor line structure 38A physically contacts outer sidewalls of vertical semiconductor channels 60 within memory openings 49 that are arranged as a pair of rows that extend along the first horizontal direction hd1 (shown in FIG. 13B). Each semiconductor line structure 38A can laterally extend along the first horizontal direction hd1. The patterned semiconductor layer stack 10 and the continuous semiconductor structure 38 collectively constitute a buried source layer (10, 38), which is a common source region for the vertical field effect transistors extending through the memory openings 49 and employing the vertical semiconductor channels 60 as respective channels.

Referring back to FIGS. 16A-16C, the semiconductor rails 38B of the continuous semiconductor structure are formed outside the volumes of the line cavities 37 and at the bottom portion of each backside trench 79. Each semiconductor rail 38B can have first bottom surfaces that are adjoined to the top surfaces of the semiconductor line structures 38A at the height of the raised bottom surfaces of the patterned upper semiconductor layer 109 (as shown by the plane P1 in FIG. 16C) and second bottom surfaces that contact recessed top surfaces of the patterned upper semiconductor layer 109, which are formed during formation of the backside trenches at the processing steps of FIG. 14. The semiconductor rails 38B laterally extends along the same horizontal direction as the backside trenches 79 as formed at the processing steps of FIG. 14.

Thus, the continuous semiconductor structure 38 is formed directly on the physically exposed lower portions of outer sidewalls of the vertical semiconductor channels. Each bottom portion of the backside trenches 79 is filled within a respective semiconductor material portion, i.e., a semiconductor rail 38B, that extends along the second horizontal direction hd2 and adjoined to the semiconductor line structures 38A. The semiconductor rails 38B and the semiconductor line structures 38A are formed as an integral continuous structure. The semiconductor rails 38B and the semiconductor line structures 38A form a continuous structure in the shape of a criss-cross array.

Figure 17:
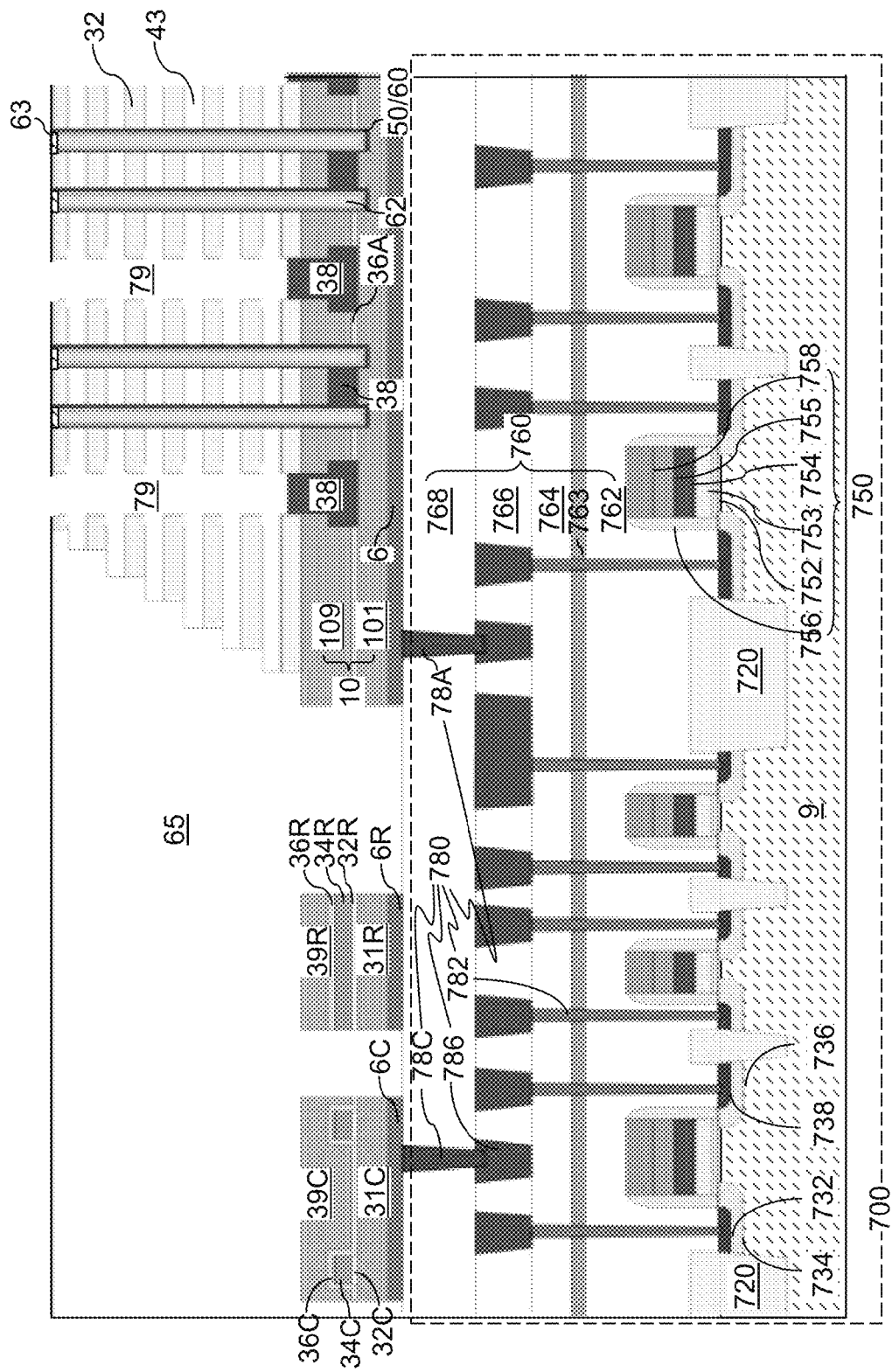
FIG. 17 is a schematic vertical cross-sectional view of the exemplary structure after formation of backside recesses according to an embodiment of the present disclosure.

Referring to FIG. 17, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the continuous semiconductor structure 38, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures (50, 60) provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures (50, 60) are formed are herein referred to as front side openings or front side cavities in contrast with the backside recesses 43. In one embodiment, the array region 100 comprises an array of monolithic three-dimensional NAND strings having a plurality of device levels disposed above the semiconductor substrate 9. In this case, each backside recess 43 can define a space for receiving a respective word line of the array of monolithic three-dimensional NAND strings.

Each of the plurality of backside recesses 43 can extend substantially parallel to the top surface of the semiconductor substrate 9. A backside recess 43 can be vertically bounded by a top surface of an underlying insulating layer 32 and a bottom surface of an overlying insulating layer 32. In one embodiment, each backside recess 43 can have a uniform height throughout.

Figure 18:
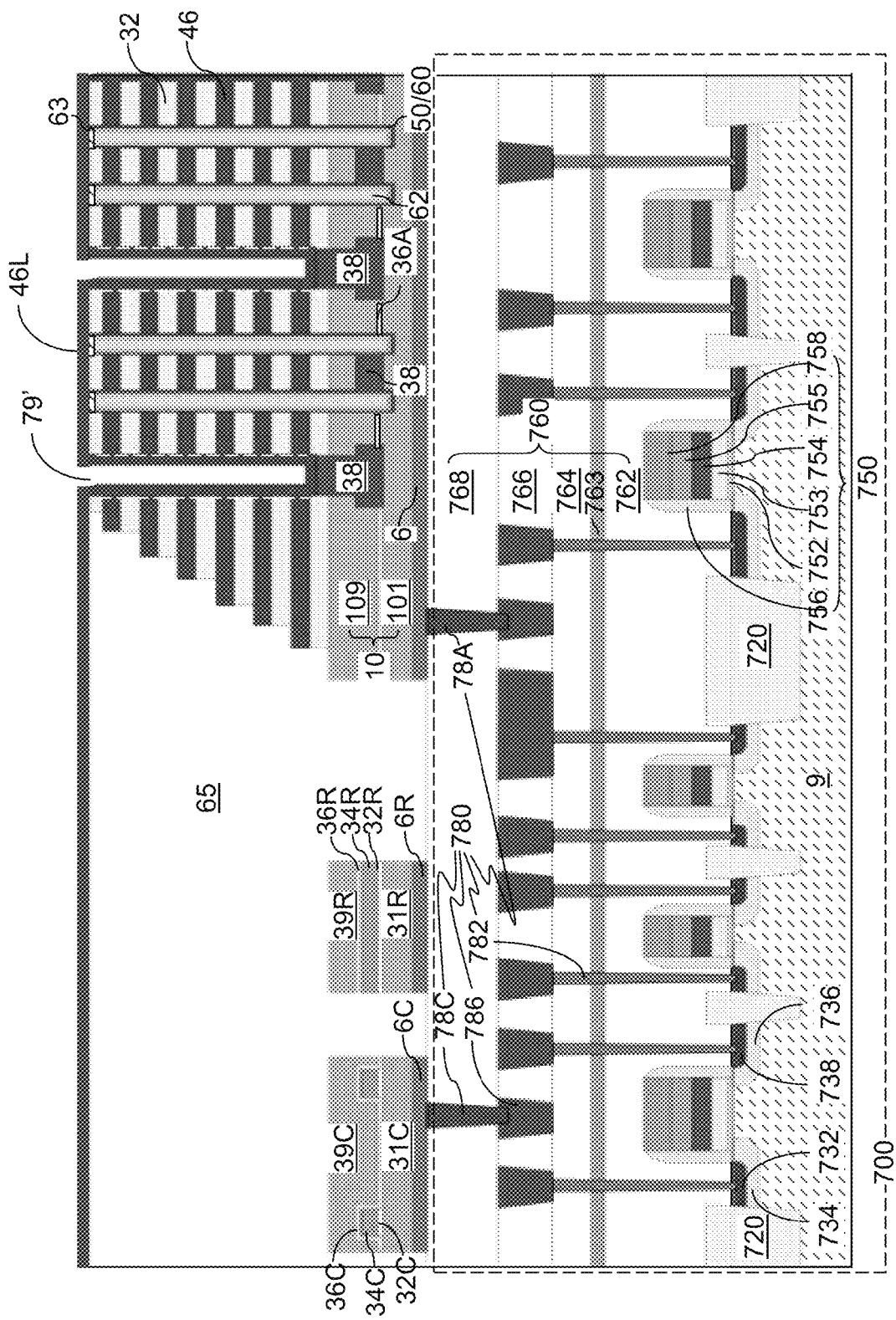
FIG. 18 is a schematic vertical cross-sectional view of the exemplary structure after formation of electrically conductive layers according to an embodiment of the present disclosure.

Referring to FIG. 18, a backside blocking dielectric layer (not shown) can be optionally formed. The backside blocking dielectric layer, if present, comprises a dielectric material that functions as a control gate dielectric for the control gates to be subsequently formed in the backside recesses 43.

At least one conductive material can be deposited in the backside recesses 43 and the backside trenches 79. The at least one conductive material can include, for example, a metallic barrier layer and a metallic fill material. The metallic barrier layer includes a material that can function as a diffusion barrier layer and/or adhesion promotion layer for a metallic fill material to be subsequently deposited. For example, the metallic barrier layer can include a conductive metallic nitride material such as TiN, TaN, WN, or a stack thereof, or can include a conductive metallic carbide material such as TiC, TaC, WC, or a stack thereof. The metal fill material can be deposited in the remaining volumes of the backside recesses 43, on the sidewalls of the at least one the backside trench 79, and over the top surface of the topmost insulating layer 32. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures (50, 60) by the metallic barrier layer, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers, which can be a pair of insulating layers 32. The continuous metallic material layer 46L includes a continuous portion of the metallic barrier layer and a continuous portion of the metallic fill material layer that are located in the backside trenches 79 or above the topmost insulating layer 32.

Thus, each sacrificial material layer 42 can be replaced with an electrically conductive layer 46. A backside cavity 79' is present in the portion of each backside trench 79 that is not filled with the backside blocking dielectric layer 44 and the continuous metallic material layer 46L.

Figure 19:
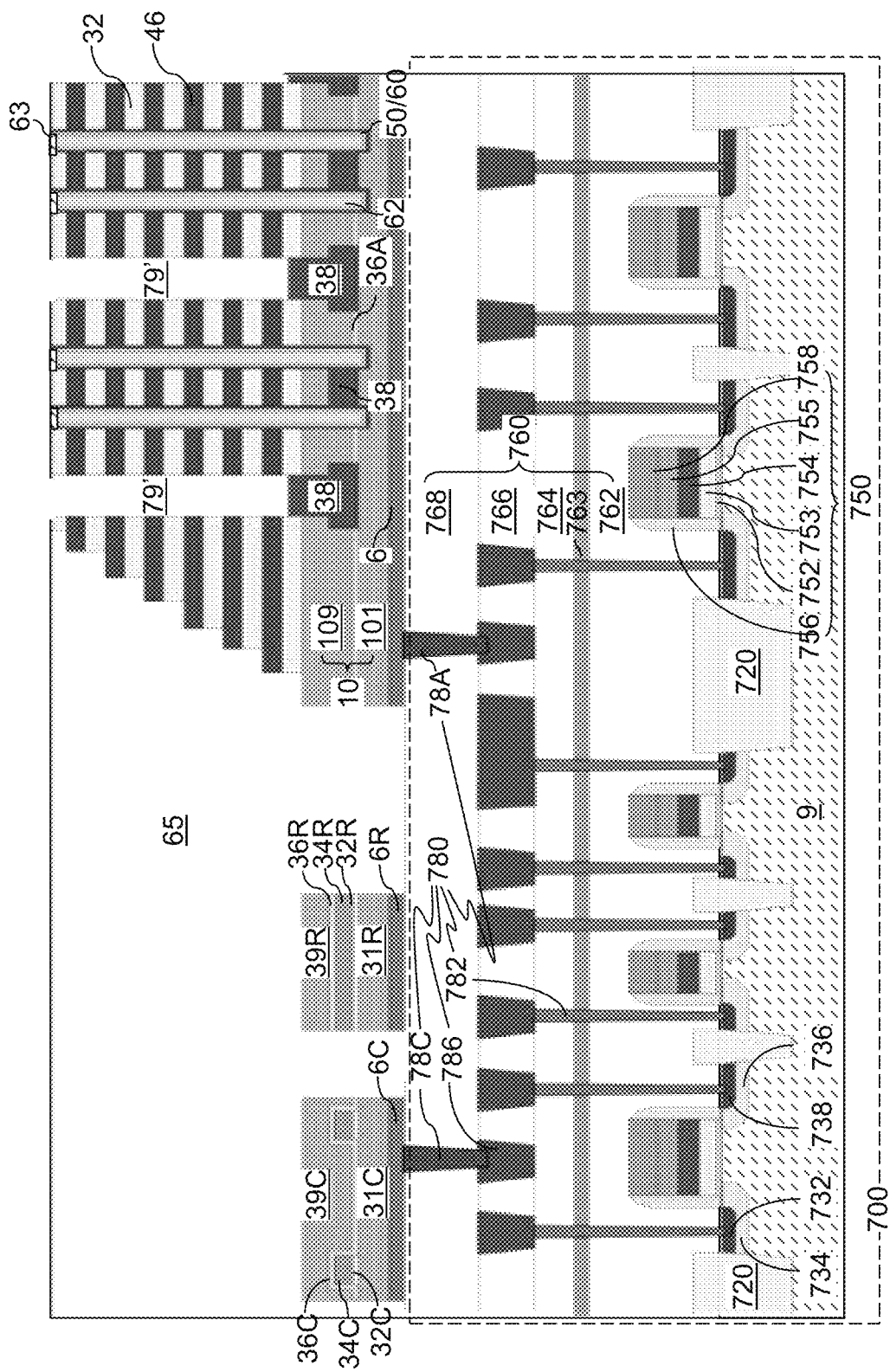
FIG. 19 is a schematic vertical cross-sectional view of the exemplary structure after removal of a deposited conductive material from within the backside trenches according to an embodiment of the present disclosure.

Referring to FIG. 19, the deposited metallic material of the continuous electrically conductive material layer 46L is etched back from the sidewalls of each backside trench 79 and from above the topmost insulating layer 32, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46. An alternating stack of the insulating layers 32 and the electrically conductive layers 46 is formed in lieu of the alternating stack of the insulating layers 32 and the sacrificial material layers 42.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures (50, 60). In other words, each electrically conductive layer 46 can be a word line that functions as a common control gate electrode for the plurality of vertical memory devices.

Figure 20A:
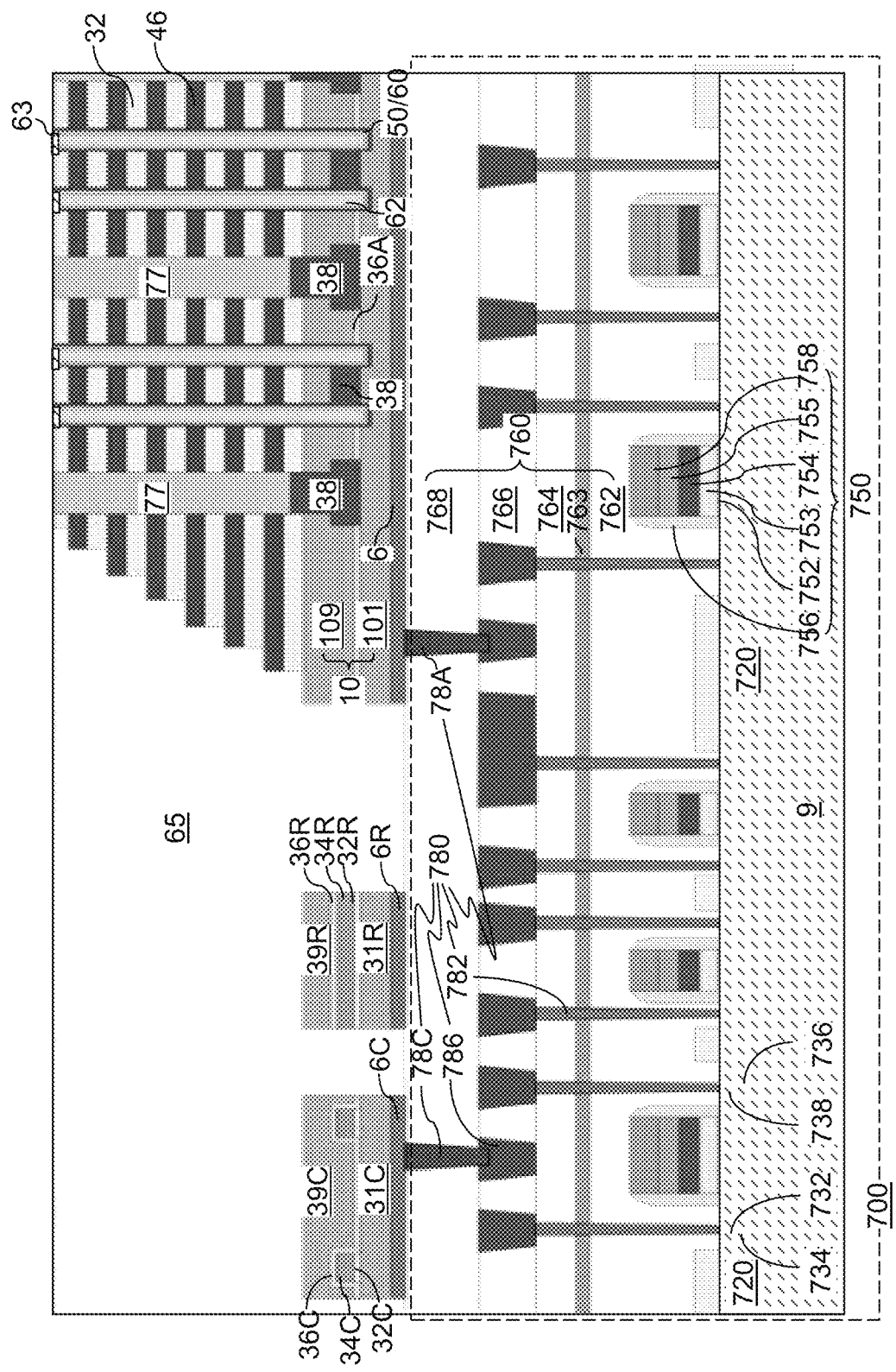
FIG. 20A is a schematic vertical cross-sectional view of the exemplary structure after formation of an insulating wall structure in each backside trench according to an embodiment of the present disclosure.
Figure 20B:
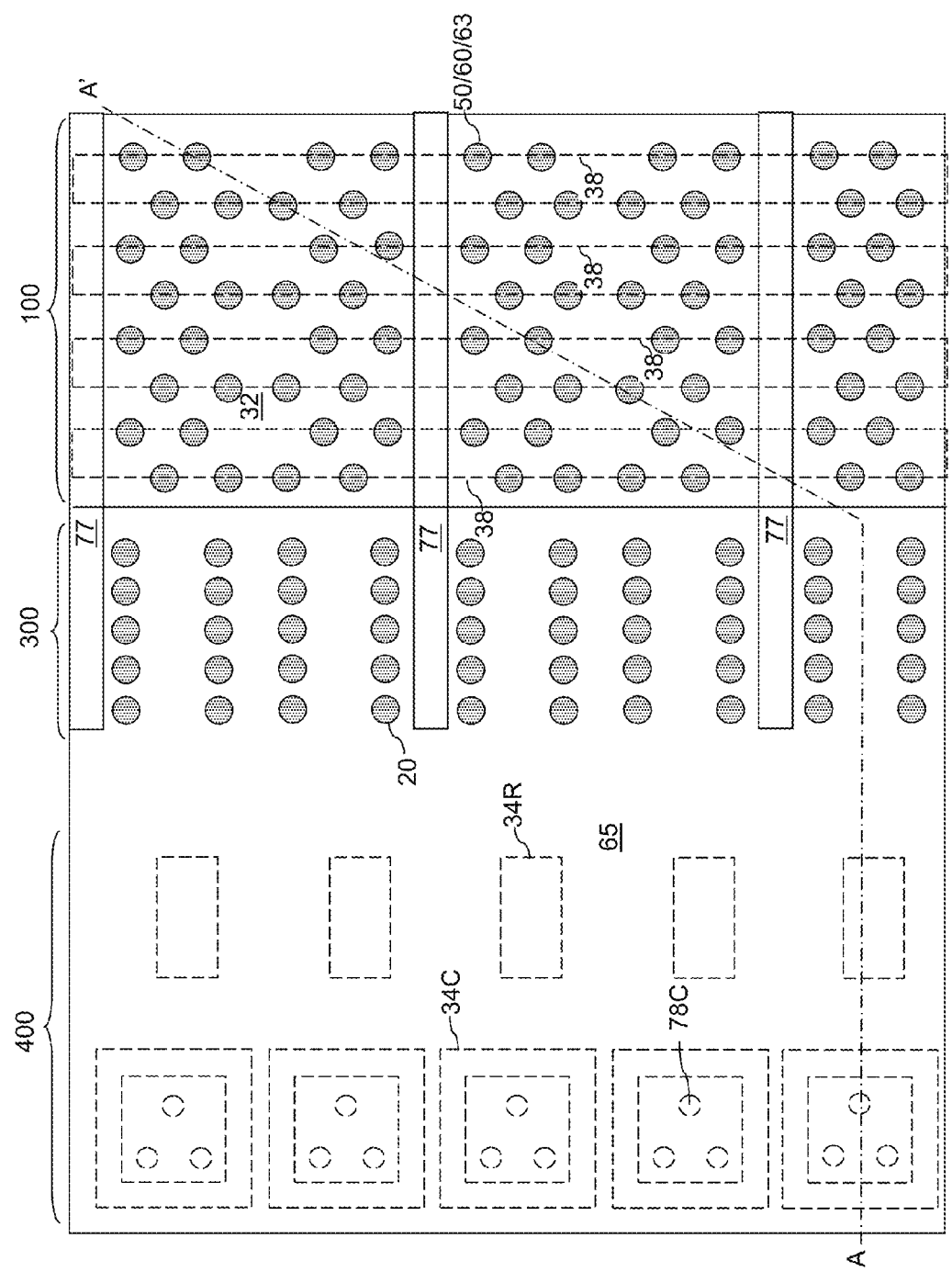
FIG. 20B is a plan (top) view of the exemplary structure of FIG. 20A. The zig-zag vertical plane A-A' corresponds to the plane of the vertical cross-sectional view of FIG. 20A.

Referring to FIGS. 20A and 20B, an insulating material can be deposited in unfilled volumes of the backside trenches 79. The insulating material can include, for example, silicon oxide, organosilicate glass, and/or silicon nitride. Excess portions of the insulating material can be removed from above the horizontal plane including the top surface of the retro-stepped dielectric material portion 65. Each remaining portion of the deposited insulating material constitutes an insulating wall structure 77, which is formed in a respective backside trench 79 and laterally extends along the second horizontal direction and vertically extends through each electrically conductive layer 46 within the alternating stack (32, 46).

Figure 21A:
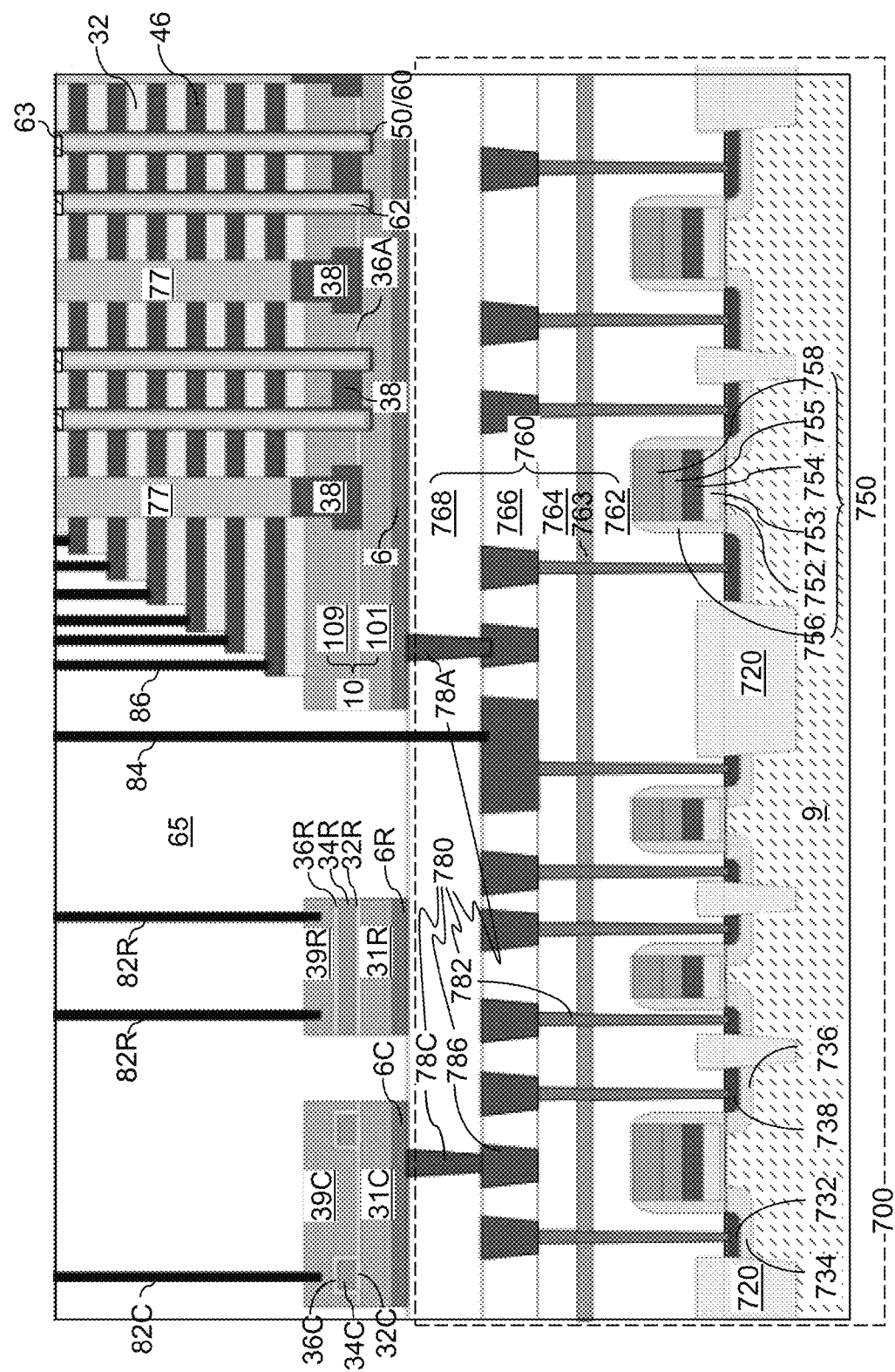
FIG. 21A is a schematic vertical cross-sectional view of the exemplary structure after formation of contact via structures according to an embodiment of the present disclosure.
Figure 21B:
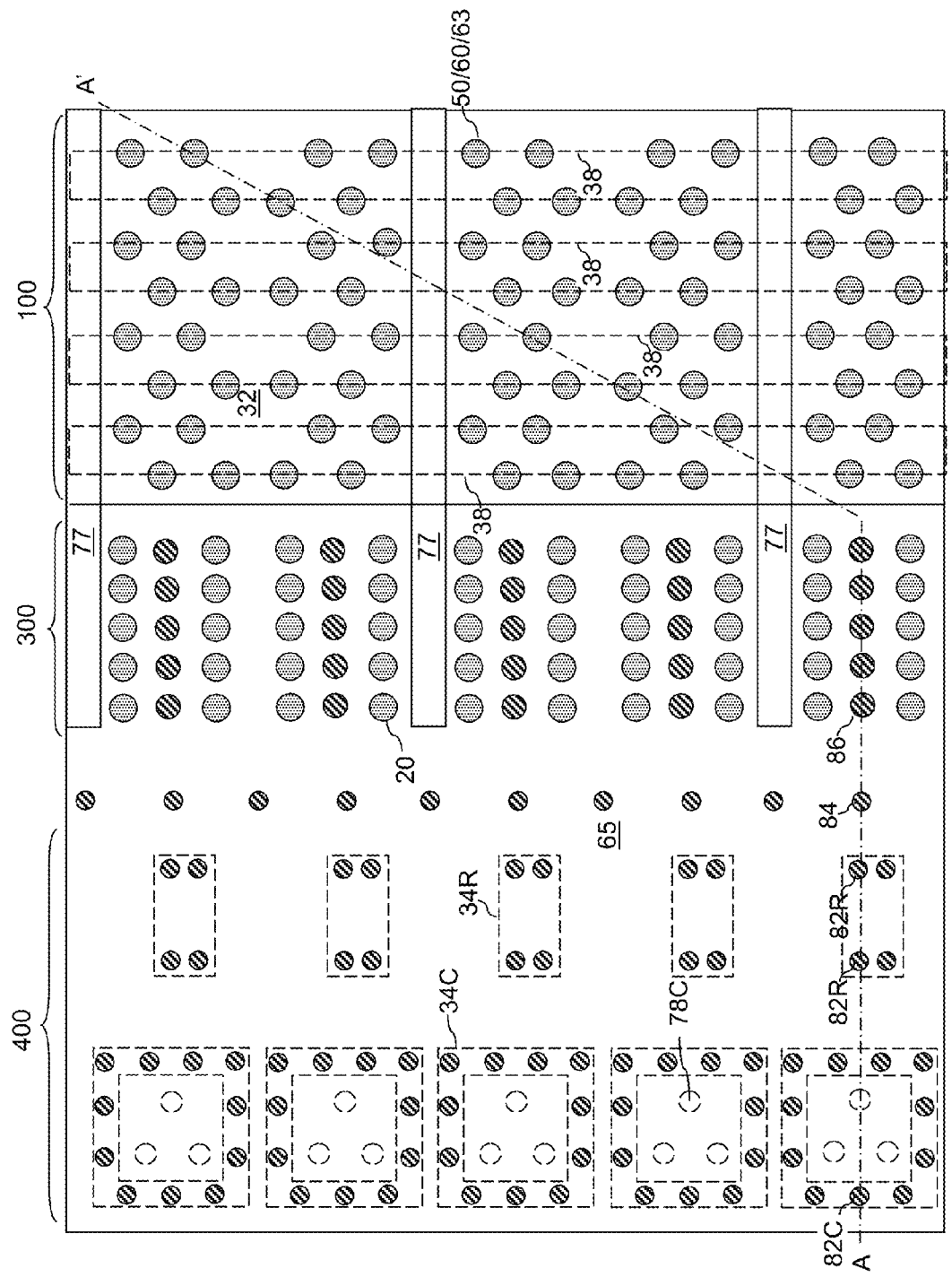
FIG. 21B is a plan (top) view of the exemplary structure of FIG. 21A. The zig-zag vertical plane A-A' corresponds to the plane of the vertical cross-sectional view of FIG. 21A.

Referring to FIGS. 21A and 21B, contact via structures (86, 84, 82R, 82C) can be formed through the retro-stepped dielectric material portion 65 onto various conductive structures underneath. For example, the contact via structures (86, 84, 82R, 82C) can include word line contact via structures 86 that contact a respective electrically conductive layers 46 at the stepped terraces; a through-tier contact via structure that extends through the entire thickness of the retro-stepped dielectric material portion 65 and through the second lower via level dielectric layer 768 and contacts a respective one of the lower level metal lines 786 or any other component of the lower metal interconnect structures 780; resistor contact via structures 82R that contact resistor-type upper semiconductor plates 39R; and upper capacitor contact via structures 82C that contact capacitor-type upper semiconductor plates 39C.

Figure 22:
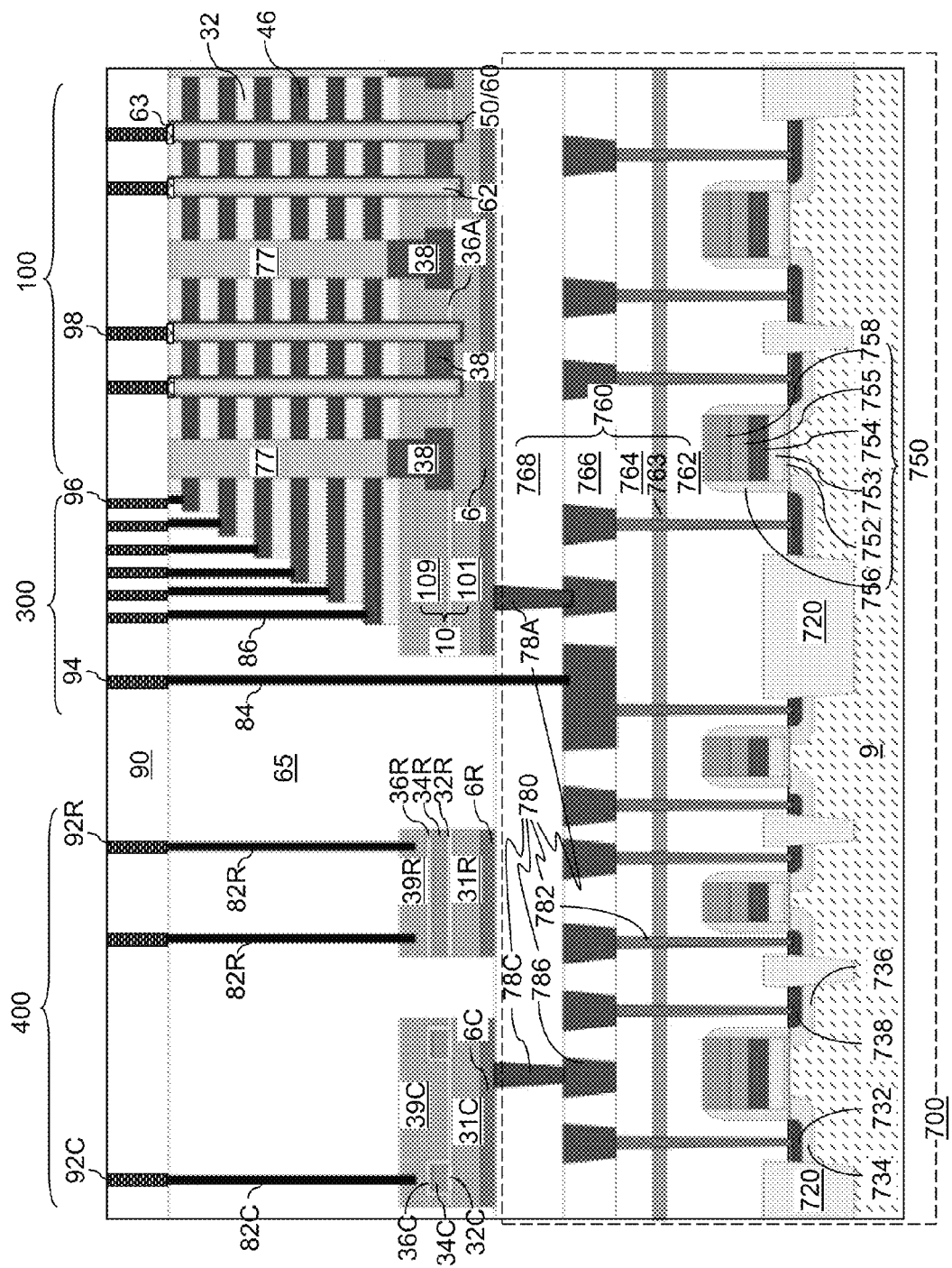
FIG. 22 is a schematic vertical cross-sectional view of the exemplary structure after formation of upper level line structures according to an embodiment of the present disclosure.

Referring to FIG. 22, at least one upper interconnect level dielectric layer 90, optional upper level via structures (not shown), and upper level line structures (98, 96, 94, 92R, 92C) can be subsequently formed. The at least one upper interconnect level dielectric layer 90 can include any dielectric material (such as silicon oxide, organosilicate glass, silicon nitride, etc.) that may be employed for embedding an upper level metal interconnect structures. The upper level via structures may be provided as needed to facilitate electrical wiring in the upper metal interconnect structures. The upper level line structures (98, 96, 94, 92R, 92C) can provide lateral electrical connection in the upper level metal interconnect structures. For example, the upper level line structures (98, 96, 94, 92R, 92C) can include bit lines 98 that provide electrical connection to the drain regions 63, word line interconnection lines 96 that provide electrical connection to the electrically conductive layers 46 (which are word lines), resistor interconnect lines 92R, and capacitor interconnect lines 92C.

Referring to FIGS. 23A and 23B, a first exemplary capacitor structure that can be provided within the exemplary structure of FIG. 22 is shown. In this case, the passive devices in the exemplary structure of FIG. 22 can include at least one capacitor. Each of the at least one capacitor can include at least one upper contact via structure (i.e., an upper capacitor contact via structures 82C) contacting a respective upper semiconductor plate (i.e., a capacitor-type upper semiconductor plate 39C); and at least one lower contact via structure (i.e., an underside capacitor contact via structure 78C) electrically shorted to a respective lower semiconductor plate (i.e., a capacitor-type lower semiconductor plate 31C). A dielectric material plate (i.e., a capacitor-type dielectric material plate 36C) can be located between the capacitor-type upper semiconductor plate 39C and the capacitor-type lower semiconductor plate 31C. The capacitor-type dielectric material plate 36C can be the node dielectric of the capacitor. A capacitor-type metal plate 6C can be provided between the capacitor-type lower semiconductor plate 31C and the underside capacitor contact via structure(s) 78C.

In one embodiment, the capacitor spacer plate 34C can include a dielectric material such as silicon nitride, and can be located in areas underlying each of the upper capacitor contact via structures 82C. In this case, the capacitor spacer plate 34C can provide protection against electrical short between the upper capacitor contact via structures 82 in case an overetch is performed during formation of the upper capacitor contact via structures 82C and the upper capacitor contact via structures 82C extend through the capacitor-type dielectric material plate 36C. A capacitor dielectric liner 32C can be provided directly underneath the capacitor spacer plate 34C. Thus, the capacitor spacer plate 34C can function as an etch stop structure in case a via cavity for forming an upper capacitor contact via structure 82C extends through the capacitor-type dielectric material plate 36C due to process variations, and thus, provides a robust electrical-short-resistant capacitor structure.

Referring to FIGS. 24A and 24B, a first exemplary resistor structure that can be provided within the exemplary structure of FIG. 22 is shown. In this case, the passive devices in the exemplary structure of FIG. 22 can include at least one resistor. Each of the at least one resistor structure can include at least one first-side contact via structure (i.e., a first subset of upper resistor contact via structures 82R) contacting a first end region of a respective upper semiconductor plate 39R, and at least one second-side contact via structure (i.e., a second subset of upper resistor contact via structures 82R) contacting a second end region of the respective upper semiconductor plate 39R. Each resistor structure can further include the resistor-type lower semiconductor plate 31R underlying the resistor-type upper semiconductor plate, and a dielectric material plate (i.e., a resistor-type dielectric material plate 36R) can be located between the resistor-type upper semiconductor plate 39R and the resistor-type lower semiconductor plate 31R. A resistor-type metal plate 6R can be provided on the bottom surface of the resistor-type lower semiconductor plate 31R.

In one embodiment, the resistor spacer plate 34R can include a dielectric material such as silicon nitride, and can be located in areas underlying each of the upper resistor contact via structures 82C. In this case, the resistor spacer plate 34R can function as an etch stop structure during formation of via cavities for forming the upper resistor contact via structures 82R. A resistor dielectric liner 32R can be provided directly underneath the resistor spacer plate 34R.

Figure 25A:
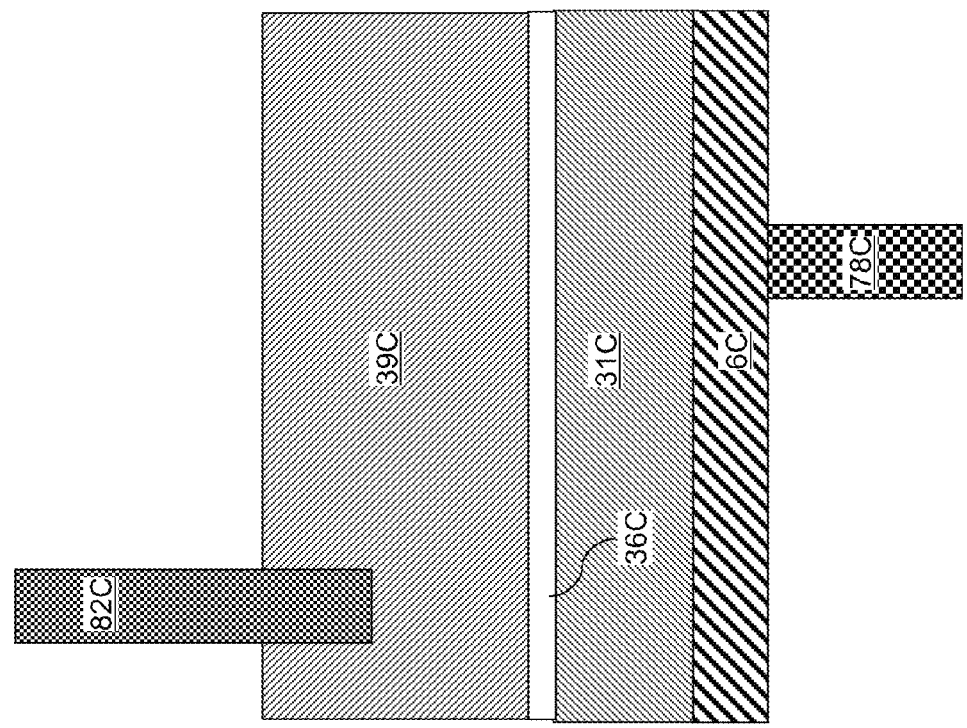
FIG. 25A is a schematic vertical cross-sectional view of a second exemplary capacitor structure according to an embodiment of the present disclosure.

The capacitor spacer plates 34C and the capacitor dielectric liners 32C are optional structures, and as such, can be removed, for example, by removing the spacer material layer 34L and the lower dielectric layer 32L from the areas of the capacitor structures to be subsequently formed at the processing steps of FIGS. 4A, 4B, and 5. A second exemplary capacitor structure that can be formed by this modification is illustrated in FIGS. 25A and 25B.

Figure 26:
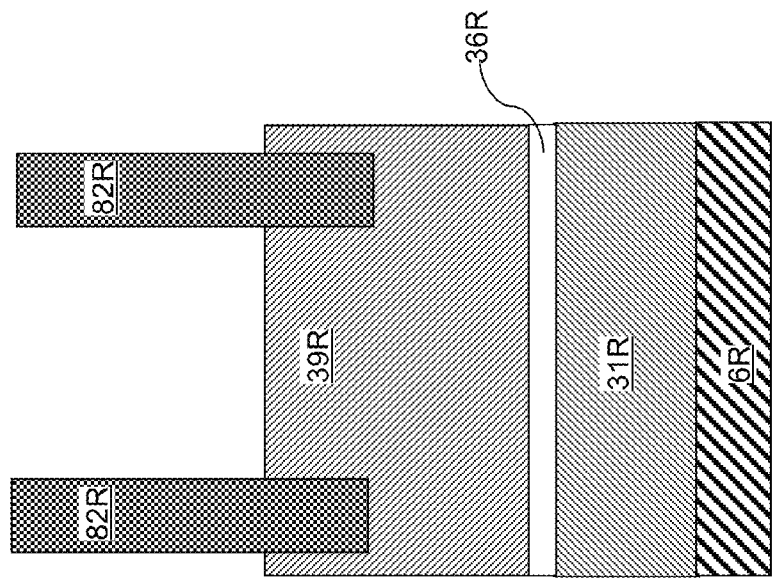
FIG. 26 is a schematic vertical cross-sectional view of a second exemplary resistor structure according to an embodiment of the present disclosure.

Likewise, the resistor spacer plates 34R and the resistor dielectric liners 32R are optional structures, and as such, can be removed, for example, by removing the spacer material layer 34L and the lower dielectric layer 32L from the areas of the resistor structures to be subsequently formed at the processing steps of FIGS. 4A, 4B, and 5. A second exemplary resistor structure that can be formed by this modification is illustrated in FIG. 26.

Referring back to FIG. 22, the exemplary structure of the present disclosure includes a semiconductor structure which includes: a buried source layer (10, 38) located over a semiconductor substrate 9 and including a first layer stack of a patterned lower semiconductor layer 101, a patterned dielectric material layer 36A, and a patterned upper semiconductor layer 109. Semiconductor line structures 38A extend through openings in the patterned dielectric material layer 36A in the vertical direction. The semiconductor structure further includes an alternating stack (32, 46) of insulating layers 32 and electrically conductive layers 46 overlying the first layer stack (101, 36A, 109); memory stack structures (50, 60) extending through the alternating stack (32, 46), the patterned upper semiconductor layer 109, and the dielectric material layer 36A; and at least one passive device {(6R, 31R, 32R, 34R, 36R, 39R), (6C, 32C, 32C, 34C, 36C, 39C)} located at a same level as the first layer stack (101, 36A, 109), wherein each of the at least one passive device {(6R, 31R, 32R, 34R, 36R, 39R), (6C, 32C, 32C, 34C, 36C, 39C)} comprises a respective second layer stack that includes: a lower semiconductor plate (31R or 31C) that is vertically spaced from the semiconductor substrate 9 by a same distance as the patterned lower semiconductor layer 101 is from the semiconductor substrate 9; a dielectric material plate (36R or 36C) contacting the lower semiconductor plate (31R or 31C) and vertically spaced from the semiconductor substrate 9 by a same distance as the patterned dielectric material layer 36A is from the semiconductor substrate 9; and an upper semiconductor plate (39R or 39C) contacting a top surface of the dielectric material plate (36R or 36C). The at least one passive device comprises at least one of a resistor and a capacitor.

In one embodiment, the semiconductor structure can further include at least one contact via structure (82R or 82C) that contacts the upper semiconductor plate (39R or 39C) and extending upward from the upper semiconductor plate (39R or 39C). In one embodiment, the lower semiconductor plate (31R or 31C) can have a same thickness as, and a same composition as, the patterned lower semiconductor layer 101; the dielectric material plate (36R or 36C) can have a same thickness as, or a same composition as, the patterned dielectric material layer 36A; and the upper semiconductor plate (39R or 39C) can have a same composition as the patterned upper semiconductor layer 109.

In one embodiment, each of the memory stack structures (50, 60) can comprise: a vertical semiconductor channel 60 that extend vertically through the alternating stack (32, 46); and a memory film 50 that laterally surrounds the vertical semiconductor channel 60 and including a lateral opening at a level of the patterned upper semiconductor layer 109. The vertical semiconductor channel 60 contacts a sidewall of a respective one of the semiconductor line structures 38A through the lateral opening in the memory film 50. In one embodiment, the semiconductor line structures 38A are parallel among one another and laterally extend along a first horizontal direction hd1 and laterally spaced apart among one another along a second horizontal direction hd2. Insulating wall structures 77 that vertically extend through the alternating stack (32, 46) and laterally extend along the second horizontal direction hd2 can be disposed over the semiconductor line structures 38A.

The semiconductor structure can further comprise: at least one transistor located on a top surface of the semiconductor substrate 9; and at least one interconnect level dielectric layer 760 located over the at least one transistor and underlying the first layer stack (101, 36A, 109) and embedding a lower level metal interconnect structure 780 therein. The lower level metal interconnect structure 780 can include at least one lower level metal line 786 and at least one lower level via structure (782, 78C, 78A).

In one embodiment, one of the at least one passive device can be a resistor comprising: at least one first-side contact via structure 82R contacting a first end region of a respective upper semiconductor plate 39R; and at least one second-side contact via structure 82R contacting a second end region of the upper semiconductor plate 39R. In one embodiment, the passive device can further comprise: a spacer material plate 34R underlying a respective dielectric plate 36R of the passive device; and a dielectric liner 32R located between the spacer material plate 34R and the lower semiconductor plate 31R of the passive device. Outer peripheries of the upper semiconductor plate 39R, the dielectric material plate 36R, the spacer material plate 34R, the dielectric liner 32R, and the lower semiconductor plate 31R can have vertically coincident sidewalls. As used herein, multiple elements can have vertically coincident sidewalls if the sidewalls of the multiple elements overlie or underlie one another and if there exists a vertical plane that includes the sidewalls of the multiple elements.

In one embodiment, one of the at least one passive device can be a capacitor comprising: at least one upper contact via structure 82C contacting a respective upper semiconductor plate 39C; and at least one lower contact via structure 78C electrically shorted to a respective lower semiconductor plate 31C. The dielectric material plate 36C can be a node dielectric of the capacitor. In one embodiment, the passive device can further comprise a patterned material stack including, from bottom to top, a dielectric liner 32C and a spacer material plate 34C. The patterned material stack (32C, 34C) can be located between the dielectric material plate 36C and the lower semiconductor plate 31C of the passive device. The dielectric material plate 36C can conformally extends over sidewalls and a top surface of the patterned material stack (32C, 34C). A portion of the dielectric material plate 36C contacting the lower semiconductor plate 31C constitutes a node dielectric of the capacitor. The at least one upper contact via structure 82C can overlie, and can be located within an area of, the patterned material stack (32C, 34C).

In one embodiment, the dielectric material plate (36R, 36C) of the passive device can contact a bottom surface of the upper semiconductor plate (39R, 39C) and a top surface of the lower semiconductor plate (31R, 31C) of the passive device as illustrated in FIGS. 23A, 25A, and 26.

The exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The semiconductor substrate 9 can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the semiconductor substrate 9, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion 60 of each of the plurality of semiconductor channels 60 extends substantially perpendicular to a top surface of the semiconductor substrate 9; and a plurality of charge storage elements (as embodied as charge trapping material portions). Each charge storage element can be located adjacent to a respective one of the plurality of semiconductor channels 60.

The various transistors located directly on the semiconductor substrate 9 can include CMOS circuitry, which can include the peripheral circuitry for operating the memory devices formed in the array region 100. The CMOS circuitry can include a first region that does not underlie the array region 100 or the contact region 300 (i.e., located in the peripheral region 400), and a second region that underlies the array region 100 or the contact region 300. Further, the peripheral region 400 includes passive devices such as capacitor structures and/or resistor structures. The passive devices in the peripheral region 400 can be employed in conjunction with the CMOS circuitry located on the semiconductor substrate 9 to provide effective operation of the peripheral circuitry (that includes the CMOS circuitry and the passive devices) for the three-dimensional array device of the present disclosure.

One non-limiting advantage of the structures of the present disclosure include compact footprint for the passive devices because the passive devices are formed over the CMOS circuitry and does not take up extra substrate area. One non-limiting advantage of the methods of the present disclosure include minimal increase in processing steps and cost because the processing steps employed to form the passive devices are processes that are necessary to form the continuous semiconductor structures 38, which function as buried source lines for the three-dimensional memory device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A method of forming a semiconductor structure, comprising:
   forming a layer stack comprising a lower semiconductor layer, a lower dielectric layer, and a spacer material layer over a semiconductor substrate;
   patterning the spacer material layer to form spacer line structures that extend along a first horizontal direction in an array region;
   forming an upper dielectric layer and an upper semiconductor layer over the spacer line structures and the lower semiconductor layer;
   forming an alternating stack of insulating layers and spacer material layers over the upper semiconductor layer in the array region;
   forming memory stack structures extending through the alternating stack, the upper semiconductor layer, and the upper dielectric layer;
   patterning at least the upper semiconductor layer, the upper dielectric layer, and the lower semiconductor layer to form

(a) a first layer stack comprising a patterned lower semiconductor layer, a patterned upper dielectric layer, and a patterned upper semiconductor layer; and (b) at least one passive device including a respective second layer stack that comprises a lower semiconductor plate that is a patterned portion of the lower semiconductor layer, a dielectric material plate that is a patterned portion of the upper dielectric layer, and an upper semiconductor plate that is a patterned portion of the upper semiconductor layer, wherein the at least one passive device comprises at least one of a resistor and a capacitor.

2. The method of claim 1, further comprising:

forming at least one transistor on a top surface of the semiconductor substrate;

forming at least one lower interconnect level dielectric layer; and forming a lower level metal interconnect structure comprising at least one lower level metal line and at least one lower level via structure over the at least one transistor, wherein:

the lower level metal interconnect structure is embedded within the at least one lower interconnect level dielectric layer; and the layer stack comprising the lower semiconductor layer, the lower dielectric layer, and the spacer material layer is formed over the lower level metal interconnect structure.

3. The method of claim 1, wherein:

the lower semiconductor plate is vertically spaced from the semiconductor substrate by a same distance as the patterned lower semiconductor layer is from the semiconductor substrate;

the dielectric material plate is vertically spaced from the semiconductor substrate by a same distance as the patterned dielectric material layer is from the semiconductor substrate; and an upper semiconductor plate is vertically spaced from the semiconductor substrate by a same distance as the patterned upper semiconductor layer is from the semiconductor substrate.

4. The method of claim 1, further comprising:

forming backside trenches extending along a second horizontal direction through the alternating stack of insulating layers and sacrificial material layers;

forming line cavities by removing at least the spacer line structures; and filling the line cavities with a doped semiconductor material to form semiconductor line structures.

5. The method of claim 4, wherein:

the semiconductor line structures comprise buried source lines of a NAND memory device;

each of the memory stack structures comprises a respective semiconductor channel and a respective memory film that laterally surrounds the respective semiconductor channel;

the method further comprises removing portions of the memory films around the line cavities to physically expose a lower portion of an outer sidewall of each semiconductor channel, and the semiconductor line structures are formed directly on the physically exposed lower portions of outer sidewalls of the semiconductor channels.

6. The method of claim 4, wherein:

each bottom portion of the backside trenches is filled within a respective semiconductor material portion that extends along the second horizontal direction and adjoined to the semiconductor line structures; and the respective semiconductor material portion and the semiconductor line structures are formed as an integral continuous structure.

7. The method of claim 1, wherein one of the at least one passive device is a resistor comprising:

at least one first-side contact via structure contacting a first end region of a respective upper semiconductor plate; and at least one second-side contact via structure contacting a second end region of the respective upper semiconductor plate.

8. The method of claim 1, wherein one of the at least one passive device is a capacitor comprising:

at least one upper contact via structure contacting a respective upper semiconductor plate; and at least one lower contact via structure electrically shorted to a respective lower semiconductor plate, wherein the dielectric material plate is a node dielectric of the capacitor.

* * * * *